(12) United States Patent
Jones

(10) Patent No.: US 7,750,749 B2
(45) Date of Patent: Jul. 6, 2010

(54) SWITCHING CIRCUIT, AND A MODULATOR, DEMODULATOR OR MIXER INCLUDING SUCH A CIRCUIT

(75) Inventor: Christopher Geraint Jones, Maidstone (GB)

(73) Assignee: Mediatek Inc., Hsin-Chu (TW)

( * ) Notice: Subject to any disclaimer, the term of this patent is extended or adjusted under 35 U.S.C. 154(b) by 431 days.

(21) Appl. No.: 11/315,720

(22) Filed: Dec. 22, 2005

(65) Prior Publication Data

US 2007/0116015 A1    May 24, 2007

(30) Foreign Application Priority Data

Nov. 3, 2005    (GB) .................................... 0522477

(51) Int. Cl.
H04L 27/20    (2006.01)
(52) U.S. Cl. ........................ 332/105; 332/103; 332/146; 327/359; 455/293; 455/326
(58) Field of Classification Search ................. 332/103, 332/105, 146; 327/359; 455/323, 326, 293, 455/189.1, 302, 313
See application file for complete search history.

(56) References Cited

U.S. PATENT DOCUMENTS

| | | | | |
|---|---|---|---|---|
| 5,526,389 A | * | 6/1996 | Buell et al. ................. | 375/150 |
| 5,630,228 A | * | 5/1997 | Mittel ........................ | 455/326 |
| 5,867,778 A | * | 2/1999 | Khoury et al. .............. | 455/321 |
| 6,029,059 A | | 2/2000 | Bojer | |
| 6,144,846 A | * | 11/2000 | Durec ........................ | 455/323 |
| 6,348,830 B1 | * | 2/2002 | Rebeiz et al. ............... | 327/355 |
| 6,438,365 B1 | * | 8/2002 | Balteanu ..................... | 455/326 |
| 7,062,247 B2 | * | 6/2006 | Kovacevic et al. .......... | 455/323 |
| 7,233,774 B2 | * | 6/2007 | Behzad ....................... | 455/76 |
| 7,398,073 B2 | * | 7/2008 | Pullela et al. ............... | 455/313 |

FOREIGN PATENT DOCUMENTS

EP    1289125    3/2003

OTHER PUBLICATIONS

PCT international search report, PCT/US2006/041407, Mar. 2, 2007.
Terrovitis et al, "Noise in Current-Commutating CMOS Mixers", IEEE Journal of Solid-State Circuits, vol. 34, No. 6, Jun. 1999, pp. 772-783.

* cited by examiner

*Primary Examiner*—Robert Pascal
*Assistant Examiner*—Levi Gannon
(74) *Attorney, Agent, or Firm*—Winston Hsu

(57) ABSTRACT

A switching circuit comprising: first and second steering switches operable to make or break a path between first and second terminals thereof, and each steering switch further having a control terminal for controlling the switch, the first and second steering switches having their control terminals driven by first and second switching signals, the first and second switching signals having a first frequency and the second switching signal being in anti-phase with the first switching signal and a first chopping switch operable to make or break a path between first and second terminals thereof and being connected in series with at least one of the first and second steering switches and receiving at its first terminal an input to be modulated, wherein the control terminal of the chopping switch is driven by a first switching control signal such that the chopping switch is non-conducting while the first and second steering switches are changing between being conducting and being non-conducting.

25 Claims, 18 Drawing Sheets

SWITCHING CIRCUIT, AND A MODULATOR, DEMODULATOR OR MIXER INCLUDING SUCH A CIRCUIT

FIELD OF THE INVENTION

The present invention relates to a switching circuit for use inside a modulator or a demodulator or mixer and to a modulator or a demodulator or mixer including such a circuit.

BACKGROUND OF THE INVENTION

Many transmission schemes encode data by modulating the amplitude and phase of a carrier so as to represent a symbol within a constellation diagram of the type shown in FIG. 1. The constellation diagram has axes extending in the real and the imaginary directions. The real and imaginary directions are orthogonal. In practical terms, if the real direction is represented by a sinusoid sin(ωt) then the imaginary is represented by $$\sin\left(\omega t + \frac{\pi}{2}\right) = \cos(\omega t).$$

Therefore an arbitrary symbol, such as that designated 2 can be represented by a suitable combination of the signals sin ωt and cos ωt. Modulators suitable for doing this are known as I-Q modulators and an example of such a modulator is shown in FIG. 2. It works well but exhibits significant output noise which tends to become exacerbated when trying to run at increased output power because of the greater currents required to drive the gates of the switching transistors.

SUMMARY OF THE INVENTION

According to a first aspect of the present invention there is provided a switching circuit comprising: first and second steering switches operable to make or break a path between first and second terminals thereof, and each steering switch further having a control terminal for controlling the switch, the first and second steering switches having their control terminals driven by first and second switching signals, the first and second switching signals having a first frequency and the second switching signal being in anti-phase with the first switching signal and a first chopping switch operable to make or break a path between first and second terminals thereof and being connected in series with the first and second steering switches and receiving at its first terminal an input to be modulated, wherein the control terminal of the chopping switch is driven by a first switching control signal such that the chopping switch is non-conducting while the first and second steering switches are changing between being conducting and being non-conducting.

Preferably the steering switches and the chopping switches are transistors.

It is thus possible to use such a switching circuit to improve noise performance of, for example a modulator by ensuring that the first and second steering switches, which may be implemented as first and second switching transistors switch during a time when they are not carrying current. This in turn reduces the effect of jitter in the signals which control the steering switches, and thereby enables more buffer circuits to be used between a timing signal generator and the first and second switching transistors thereby allowing bigger switching transistors to be used. This in turn means that the modulator is capable of producing more power and hence the amplifier that follows the modulator need not apply so much gain. This in turn means that the noise produced in the modulator will be amplified less, and therefore less noise will be present in the amplified signal.

Preferably the switching control signal which controls the first chopping switch, which may be implemented using a third transistor, has a frequency twice that of the first and second switching signals. In a preferred embodiment the switching control signal is derived from an oscillator and is supplied to a divide by two counter in order to generate the first and second switching signals.

Advantageously a plurality of switching circuits are provided so as to form an I-Q modulator. For an I-Q modulator two further switching signals, i.e. a third and fourth signal are required having the same frequency as the first switching signal. The third switching signal is 90° (π/2 radians) out of phase with the first switching signal and the fourth switching signal is 270° (3π/2 radians) out of phase with the first switching signal.

In a preferred embodiment, an I-Q modulator is provided which has first to fourth switching circuits therein. The first switching circuit is arranged to provide a modulated output signal along the positive real axis of the phase space represented by the constellation diagram of FIG. 1. The second switching circuit is arranged to provide a modulated output signal along the negative real axis of the phase space. The first and second switching circuits are driven by the first and second switching signals. Similarly the third and fourth switching circuits are driven by the third and fourth switching signals and are used to provide a modulated output along the positive imaginary axis and the negative imaginary axis of the phase space as represented in the constellation diagram, respectively.

The modulator described herein can be used to encode more complex transmission schemes than that shown in FIG. 1 and can, for example, be used to encode 16 QAM and 64 QAM transmission schemes, or also to produce phase modulation, frequency modulation, amplitude modulation, single-sideband, orthogonal frequency division multiplexing and any other modulation scheme.

Advantageously an analysis circuit is provided for analysing the relative timings between the first, second (and optionally third and fourth) switching signals and the switching control signal.

It is common practise to refer to the switching signals provided to the modulator as being local oscillator (LO) signals. This convention will be used herein. However, as the first chopping switch is driven in the preferred embodiments by a signal at twice the frequency of the local oscillator signal, this switching control signal will also be referred to as $V_{OSC}$ or alternatively as a double rate LO signal.

Advantageously a plurality of modulator cores are provided and are connected to a shared output such that a modulator having a variable output can be provided. Some of the modulator cores may be connected via an attenuating network. Different modulator cores may be connected at different nodes of the attenuating network such that output power control can be achieved by energising a selected one or more of the modulator cores.

The modulator cores of the present invention are especially suited for being connected together because propagation delays or other slight variations between the switching signals provided to the switching transistors (being those LO signals derived from the frequency divider/counter) do not give rise to switching errors in the output signal because the transistors are not carrying current at the switching instant.

According to a second aspect of the present invention there is provided a mixer cell, comprising two differential pairs of transistors, further including two additional chopping transistors, one of which is interposed in the common current path to each respective pair of transistors within the mixer cell, and which, in use, is placed in a high impedance state whilst the transistors of the associated differential pair are switching between conducting and non-conducting states.

According to a third aspect of the present invention there is provided a modulator having first and second transistors switched between on and off states in response to a control signal so as to up convert an input signal, the modulator further comprising a switch in series with the first and second transistors and a controller for controlling the switch such that the switch interrupts current flow through the first and second transistors during a period encompassing a transition of the control signal.

According to a fourth aspect of the present invention there is provided a mixing cell comprising the first to eighth field effect transistors:

the first, second, third and fourth transistors having their source terminals connected together and having their gates driven by signals approximating square or sine waves at a first frequency;

the gate of the first transistor being driven substantially in anti-phase to the gate of the second transistor;

the gate of the fourth transistor being driven substantially in anti-phase to the gate of the third transistor;

the fifth transistor having its source connected to the drain of the first transistor;

the sixth transistor having its source connected to the drain of the second transistor and having its gate connected to the gate of the fifth transistor;

the seventh transistor having its source connected to the drain of the third transistor;

and the eighth transistor having its source connected to the drain of the fourth transistor and having its gate connected to the gate of the seventh transistor;

and wherein, in use, the gates of the sixth and eighth transistors are driven by signals which approximate a square or sine wave, and which are in anti-phase to each other, and which are at a frequency which is a multiple of the first frequency;

the waveform driving the fifth and sixth transistors is timed such that the fifth and sixth transistors are substantially not conducting during the time when the difference between the gate voltages of the first and second transistors is changing in sign; and the waveform driving the gates of the seventh and eighth transistors is timed such that the seventh and eighth transistors are substantially not conducting during the time when the difference between the gate voltages of the third and fourth transistors is changing in sign.

According to a fifth aspect of the present invention there is provided a method of operating a mixing cell, for use as a mixer, modulator or demodulator the mixing cell comprising:

first to sixth transistors;

the first and second transistors arranged to form a first long tail pair, and associated with a third transistor for permitting or inhibiting current flow to the first and second transistors;

the fourth and fifth transistors arranged to form a second long tail pair and associated with a sixth transistor for permitting or inhibiting current flow to the fourth and fifth transistors;

the method comprising:

1) driving the first and second transistors with first and second switching signal, respectively, at a first frequency;

2) driving the fourth and fifth transistors with third and fourth switching signals, respectively, at the first frequency, where the third switching signal is delayed by one quarter of a period of the first switching signal, the second switching signal an inverted version the first switching signal, and the fourth switching signal is an inverted version of the third switching signal, and where switching transitions for the first and second transistors occur during periods when the third transistor is non-conducting and switching transitions for the fourth and fifth transistors occur when the sixth transistor is non-conducting.

BRIEF DESCRIPTION OF THE FIGURES

The present invention will further be described, by way of example only, with reference to the accompanying drawings, in which.

DESCRIPTION OF EMBODIMENTS OF THE INVENTION

Figure 1:
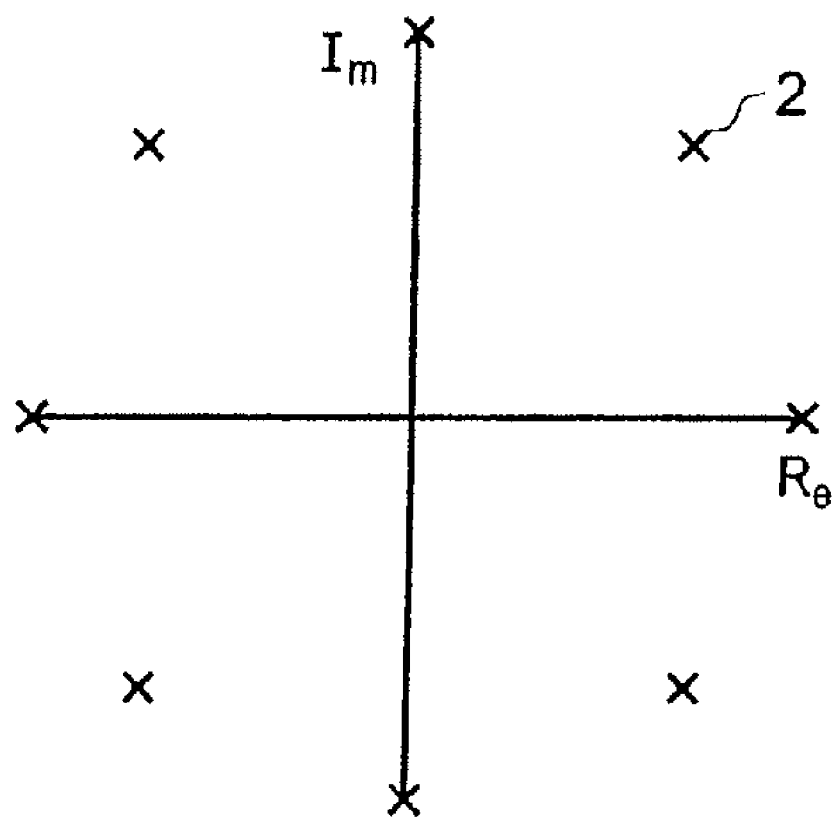
FIG. 1 illustrates a constellation diagram showing symbols to be encoded in an I-Q space.

It is worth considering how the prior art modulator operates in order to understand its limitations. The prior art modulator of FIG. 2 comprises four individual modulator switching circuits 10, 12, 14 and 16 which are identical. Therefore only the first switching circuit 10 need be described in detail. The first switching circuit 10 comprises first and second switching transistors 20 and 22 connected in a "long tailed pair" configuration. Thus the source of the first transistor 20 and the source of the second transistor 22 are connected to a common node 24. The drain of the first transistor 20 is connected to a first end of a centre tapped coil 26 whereas the drain of the transistor 22 is connected to the second end of the second tapped coil 26. The centre tap of the coil 26 is connected to a supply rail 28. The common node 24 receives a current representative of a base band signal that is to be modulated. The current may be produced by a voltage to current converter, generally designated 30 which acts as an input stage and which comprises a further field effect transistor 32 having its drain connected to the common node 24 and its source connected to ground via a resistor 36. A gate of the transistor 32 is connected to an output of an operational amplifier 38 which has its inverting input connected to a node 40 formed by the connection of the source of the transistor 32 to the resistor 36. A signal to be modulated is supplied to the non-inverting input of the amplifier 38. As a result, the current flowing through the transistor 32 is directly proportional to the voltage occurring at the non-inverting input of the amplifier 38.

In use the transistors 20 and 22 are driven in anti-phase by "local oscillator" signals $LO_I$ and $\overline{LO_I}$ the signals $LO_I$ and $\overline{LO_I}$ are derived by a counter 50 which receives a signal from an oscillator 52 and which divides it by 2 such that it can generate the signal $LO_I$, an inverse of the signal $LO_I$, which is designated $\overline{LO_I}$, and two further signals $LO_Q$ and $\overline{LO_Q}$. All of these signals have the same angular frequency $\omega_c$, or in other words they have the frequency $\omega_c/2\pi$ and if we take $LO_I$ as a reference signal represented by $\sin \omega_c t$ then $LO_Q$ is represented by $$\sin\left(\omega_c t + \frac{\pi}{2}\right), \overline{LO_I} = \sin(\omega_c t + \pi) \text{ and } \overline{LO_Q} = \sin\left(w_c t + \frac{3\pi}{2}\right).$$

It should be noted that better noise performance is achieved if the LO waveforms are actually square waves rather than sine waves, but with the phase relationship as described above. Since the square waves change state more abruptly than sine waves, electrical noise can have less effect on the time of the switching point when square waves are used.

In use transistors 20 and 22 are switched on and off in anti-phase very quickly causing the current path through the coil 26 to rapidly switch between one half and then the other half of the coil in an alternating manner. We can see that the frequency of the switching is determined by the switching rate of the signals used to control the transistors 20 and 22, and hence is at $\omega_c$ (the local oscillator frequency) whereas the magnitude of the current flowing through the coil 26 and hence through the transistors 20 and 22 is controlled by transistor 32 of the voltage to current converter.

Given that the current flowing through the transistor 32 is uni-polar, that is the current flow can be only in one direction from the positive supply 28 to the ground connection, then the circuit 10 can only modulate signals along the positive half of the real axis of FIG. 1. Therefore a similar switching circuit 12, but with the switching signals to its switching transistors being reversed is provided to modulate in the negative direction along the real axis. Similarly switching circuits 14 and 16 are provided to modulate in the positive and negative directions along the imaginary axis, respectively.

Typically the oscillator 52 when used in the a device such as a mobile telephone will run at several GHz therefore, if the oscillator where to run at 4 GHz the signals $LO_I$, $\overline{LO_I}$, $LO_Q$ and $\overline{LO_Q}$ would each have a frequency of 2 GHz.

In practise, the frequency divider 50 tends to introduce some uncertainty into the switching times of the transistors 20 and 22, and the switching times of the corresponding transistors in the other switching circuits. This can result from thermal noise in the frequency divider itself and the effect of power supply fluctuation to the divider resulting from variations in currents being drawn by other circuits receiving the power from the same power source. This jitter can be thought of as being a random variation in the delay through the divider circuit. However the action of the modulator is to convert this jitter into phase noise in the RF output signal of the modulator.

Within the context of a mobile telephone, it is normally necessary to have some amplification after the modulator in order to provide enough power to drive the transmitting antenna. All modulators will produce some noise and any stage of amplification inevitably amplifies this noise, and consequently in order to produce only a low level of noise at the transmitting antenna it is desirable to minimise the amount of gain needed between the output of the modulator and the antenna The transmission specifications for mobile telephone systems also place limits on out of band interference, such as that produced by the phase noise, and consequently it is generally necessary in the prior art to introduce a band pass filter between the output of the modulator and the amplifier in order to attenuate the phase noise. This filter increases the cost and size of the radio transmitter, as well as making operation in multiple frequency bands more complicated.

The frequency divider 50 tends to be formed of relatively small transistors as small transistors exhibit reduced parasitic capacitance and hence use less current to charge and discharge this capacitance. However, in order to produce a modulator having enough output power to drive a power amplifier of moderate gain directly, the switching transistors 20 and 22 of the modulator have to be quite large in area. This means that they have a significant gate capacitance and require, in relative terms, quite a lot of current to charge and discharge this gate capacitance at appropriate times in response to transitions in the $LO_I$, $\overline{LO_I}$, $LO_Q$ and $\overline{LO_Q}$ waveforms. This can be achieved using local oscillator buffer circuits. These buffer circuits also tend to be made of quite large transistors, but do not present such a large capacitance at their inputs as the switching transistors themselves. As a result, several buffers having transistors progressively increasing in size may be required in order to drive the switching transistors 20 and 22. These buffer circuits themselves form a further source of jitter in the switching waveforms $LO_I$, $\overline{LO_I}$, $LO_Q$ and $\overline{LO_Q}$ (which for simplicity may be referred to as local oscillator waveforms) which once again manifests itself as a phase noise in the output signal at the antenna.

The inventor has realised that the effects of jitter in the switching signal can be obviated if, at the time of a switching signal transition, each transistor switching in response to the switching signal is not passing current. FIG. 3 shows a single modulator switching circuit, equivalent to the switching circuit 10 of FIG. 2, constituting an embodiment of the present invention. It can be seen that this switching circuit now comprises three sets of transistors configured as long tailed pairs, and generally designated 80, 82 and 84. The first long tailed pair 80 comprises transistors 90 and 92 having their sources connected together at a first common mode and to the drain of a further first current control transistor 94 in the long tail pair 84. The second long tailed pair 82 comprises transistors 96 and 98 having their sources connected together at a second common node and to the drain of a second current control transistor 100. Transistors 94 and 100 are driven by a switching control signal which is at double the frequency of the LO waveforms.

The drains of the transistors 90 and 96 are connected together and form a first output, OP, which is connected to a first end of a centre tapped coil 102. The drains of the transistors 92 and 98 are connected together to form a second output, $\overline{OP}$, connected to a second end of the centred tapped coil 102. The centre tap of the coil 102 is connected to a positive supply.

The transistors 90 and 92 act to steer the current that is provided via transistor 94 to either the first output OP or to the second output $\overline{OP}$. Thus these transistors can be regarded as first and second steering switches which are driven in antiphase and act either to make a current flow path through the switch or to break the current flow path therethrough. It can also be seen that the transistor 94 also acts as a switch that enables current flow to the longtail pair 84 or inhibits, that is chops, the current flow. Therefore transistor 94 can be regarded as a first chopping switch. It is also apparent that since the transistor 94 is in series with both transistors 90 and 92, then transistor 94 could be replaced by two transistors, one being only in series with transistor 90 and the other being only in series with transistor 92. These additional transistors would both be driven by $V_{OSC}$ and can be regarded as sub-switches. In such an arrangement the sources of transistors 90 and 92 would not be connected together.

In this nomenclature, it follows that transistors 96 and 98 can be regarded as third and fourth steering transistors, and transistor 100 as a second chopping transistor.

Referring back to FIG. 2, it can be seen that the oscillator 52 provides an output oscillator signal $V_{OSC}$. In fact, the oscillator 52 is generally a dual ended device such that it provides two output signals, which are complimentary to each other, which are $V_{OSC}$ and $\overline{V_{OSC}}$. If the oscillator is single ended, then a further amplification and inversion stage can be included in order to provide buffered versions of $V_{OSC}$ and $\overline{V_{OSC}}$.

The frequency divider 50 accepts the signals $V_{OSC}$ and $\overline{V_{OSC}}$ and generates local oscillator signals $LO_I$, $\overline{LO_I}$, $LO_Q$ and $\overline{LO_Q}$ having frequencies at half of the $V_{OSC}$ frequency.

The signals $LO_I$ and $\overline{LO_I}$, can be regarded as first and second switching signals and $V_{OSC}$ as a first switching control signal.

Figure 2:
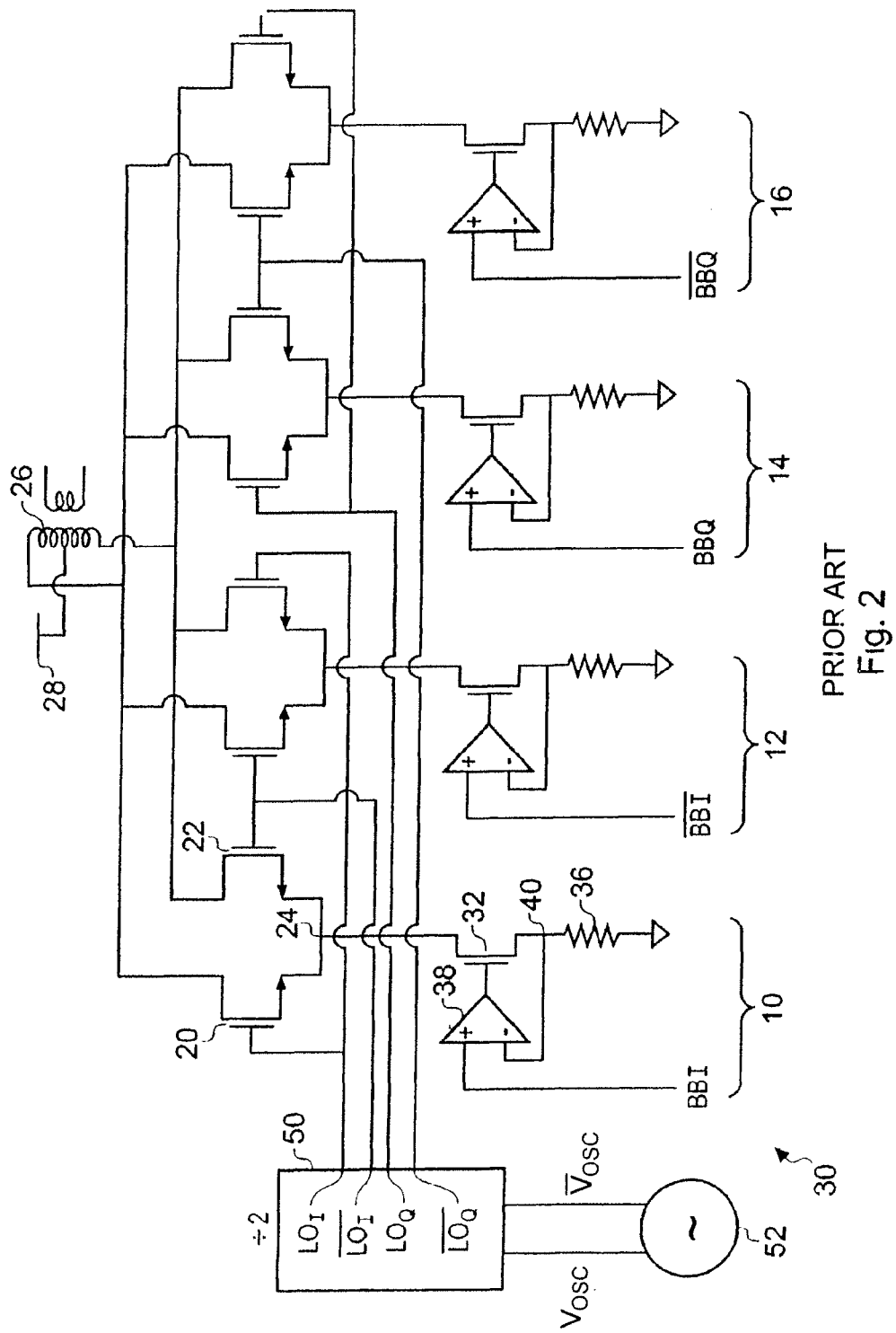
FIG. 2 illustrates a known modulator.
Figure 3:
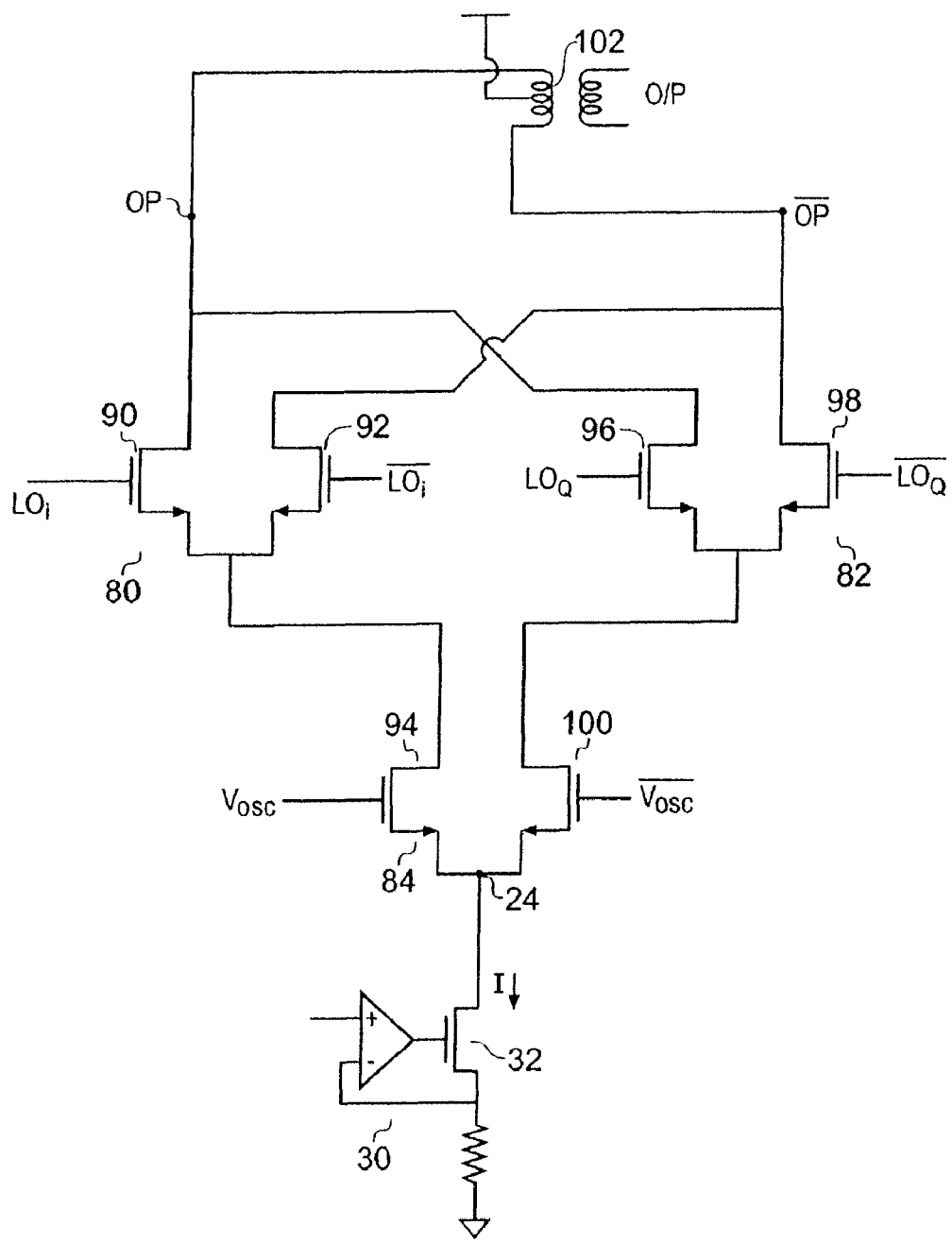
FIG. 3 is a circuit diagram of a switching circuit, suitable for use in a modulator core, and constituting an embodiment of the present invention.

Returning to FIG. 3, it can be seen that the transistors 94 and 100 are connected such that their sources are connected to a third common node 24 which receives current from a voltage to current converter 30 as described hereinbefore with respect to FIG. 2.

Figure 4:
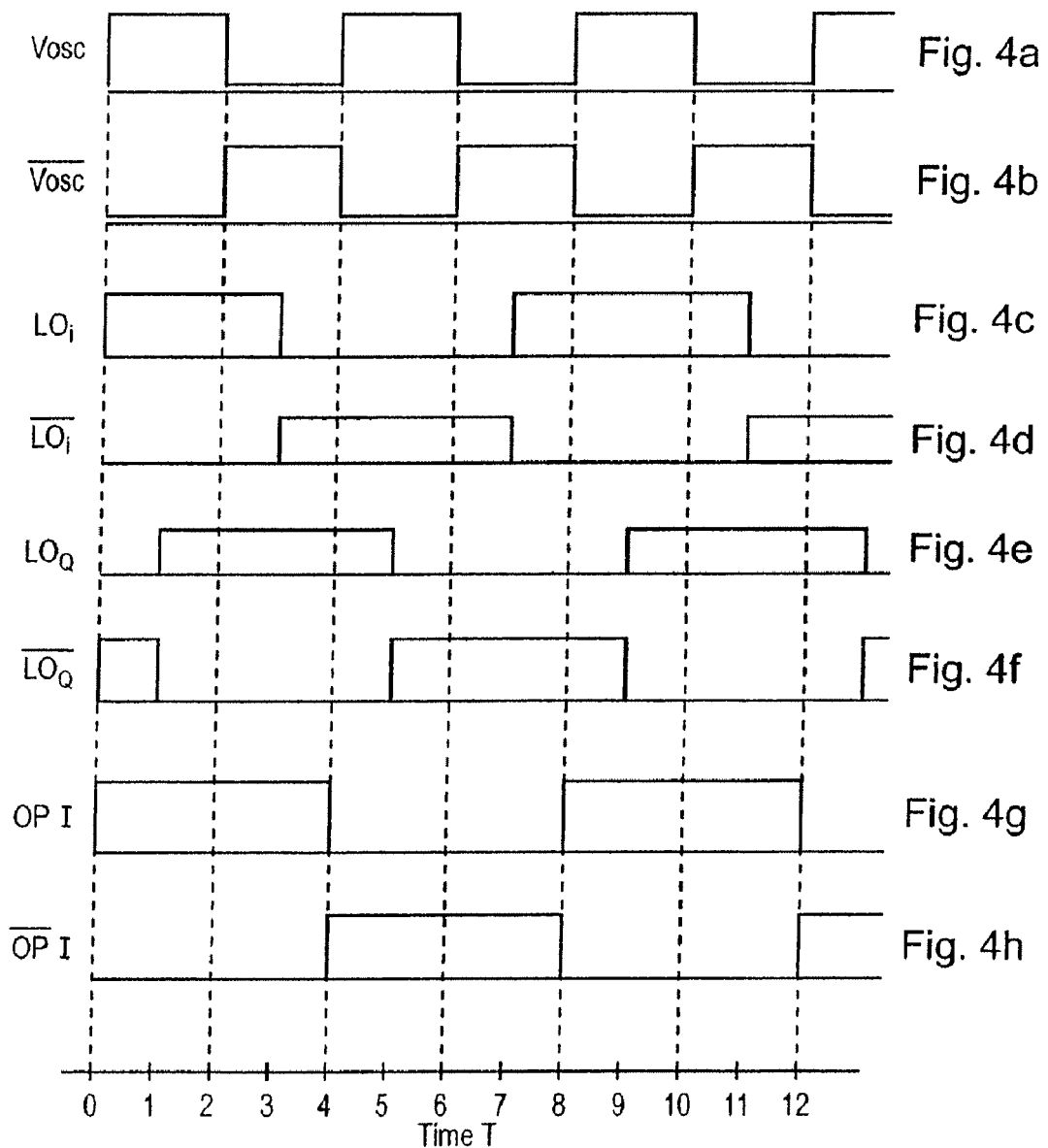
FIGS. 4a to 4h are timing diagrams illustrating the operation of the modulator core shown in FIG. 3.

FIG. 4 is a timing diagram subdivided into FIGS. 4a to 4h to help illustrate the operation of the circuit shown in FIG. 3. The signal $V_{OSC}$ is provided to a gate of the transistor 94 such that the transistor is conducting while $V_{OSC}$ is high, and non-conducting when $V_{OSC}$ is low. Transistor 100 is driven from the complimentary signal $\overline{V_{OSC}}$ and consequently transistor 100 is switched off while transistor 94 is conducting, and switched into a conducting state while transistor 94 is non-conducting. Transistor 90 is driven by the signal $LO_I$, shown in FIG. 4c, whereas transistor 92 is driven by the signal $\overline{LO_I}$ shown in FIG. 4d. Similarly transistor 96 is driven by the signal $LO_Q$ shown in FIG. 4e whereas transistor 98 is driven by the signal $\overline{LO_Q}$ shown in FIG. 4f.

From visual inspection of FIGS. 4a to 4f, it can be seen that the propagation delay between the local oscillator and the signals passing through the divide by two counter is selected such that signal transitions of the signals $LO_I$, $\overline{LO_I}$, $LO_Q$ and $\overline{LO_Q}$ do not coincide with signal transitions on $V_{OSC}$ or $\overline{V_{OSC}}$ and preferably signal transitions of the local oscillator signals occur midway between the transitions of the signals $V_{OSC}$ and $\overline{V_{OSC}}$. Failure to achieve this proper phasing can result in the advantages conveyed by the present invention being lost.

For simplicity we can assume that the current to voltage converter 30 is controlling the transistor 32 such that it is passing a current I. We can consider the current flow within the circuit shown in FIG. 3, as measured in arbitrary time units each spanning half of a clock cycle of $V_{OSC}$. For the purposes of this discussion, the circuit is assumed to have been running for a while such that all of the relevant relationships between signals have become established. Therefore, at time zero $V_{OSC}$ undergoes a transition from low to high thereby switching transistor 94 into a conducting state. Similarly transistor 100 is switched into a non-conducting state. At this time the signal $LO_I$ is also high so that transistor 90 is conducting whereas transistor 92 is not. Thus current from the positive supply is flowing through the coil 102 and via the output terminal OP through a transistor 90 to transistor 94 and from there through transistor 32 to ground. At the time period T=1 a transition occurs in the signals $LO_Q$ and $\overline{LO_Q}$ such that transistor 98 which had been in a low impedance state is switched off, and transistor 96 which had been non-conducting is switched on. However these transitions do not affect the current flow through the circuit because transistor 100 is non-conducting.

At the period T=2 the signal $V_{OSC}$ goes low thereby switching transistor 94 into a non-conducting state and the signal $\overline{V_{OSC}}$ goes high thereby switching transistor 100 on into a conducting state. As a consequence, current flow through the transistor 90 is inhibited and instead current flow occurs via the output node OP and via transistor 96 and transistor 100. Note that both before and after the instant T=2, the current will be flowing to the output OP At time T=3 the signal $LO_I$, goes low and the signal $\overline{LO_I}$ goes high. Any jitter (i.e. small changes in the switching time) of these signals is not propagated into the output of the oscillator because transistor 94 is non-conducting.

At the time T=4 $V_{OSC}$ goes high, thereby switching transistor 94 on and simultaneously transistor 100 is switched off. At this time the current flow path from the positive supply is now through the bottom half of the centre tapped coil 102, via the second output $\overline{OP}$, and then via transistor 92 and transistor 94. Therefore a transition occurs at the node OP such that the current stops flowing through it, and current starts flowing via node $\overline{OP}$.

At time T=5 a transition occurs in the signals $LO_Q$ and $\overline{LO_Q}$ thereby switching transistor 96 into a conducting state into a conducting state and transistor 98 into a non-conducting state. However any timing errors in these transitions are not propagated to the output because $V_{OSC}$ is low and consequently transistor 100 is non-conducting.

At time T=6 $\overline{V_{OSC}}$ goes high, thereby switching transistor 100 on and simultaneously transistor 94 switches off. At this time the current flow from the power supply still passes through the second output node $\overline{OP}$ but now passes through transistor 98 and transistor 100.

At time T=7 the signals $LO_I$ and $\overline{LO_I}$, switch states, thereby switching transistor 90 back on and switching transistor 92 into a non-conducting state. However at this time transistor 94 is non-conducting and consequently any switching error will not manifest itself as phase noise.

At time T=8 $V_{OSC}$ switches high thereby switching transistor 94 on, simultaneously transistor 100 is switched off. At this point transistors 94 and 90 are on thereby causing current flow via the output $\overline{OP}$ to stop and current to start flowing through the output terminal OP. Therefore another current transition occurs in the output signal.

The cycle then repeats.

From the above description it can be seen that temporal jitter in the signals $LO_I$, $\overline{LO_I}$, $LO_Q$ and $\overline{LO_Q}$ does not have any effect on the output of the modulator because at the time these signals make a transition, the transistors that they control are not passing any current. It will be appreciated that the waveforms shown in FIG. 4 are idealised and that, for a real circuit operating at frequencies approaching 4 GHz such ideal waveforms will not be observed.

Figure 5:
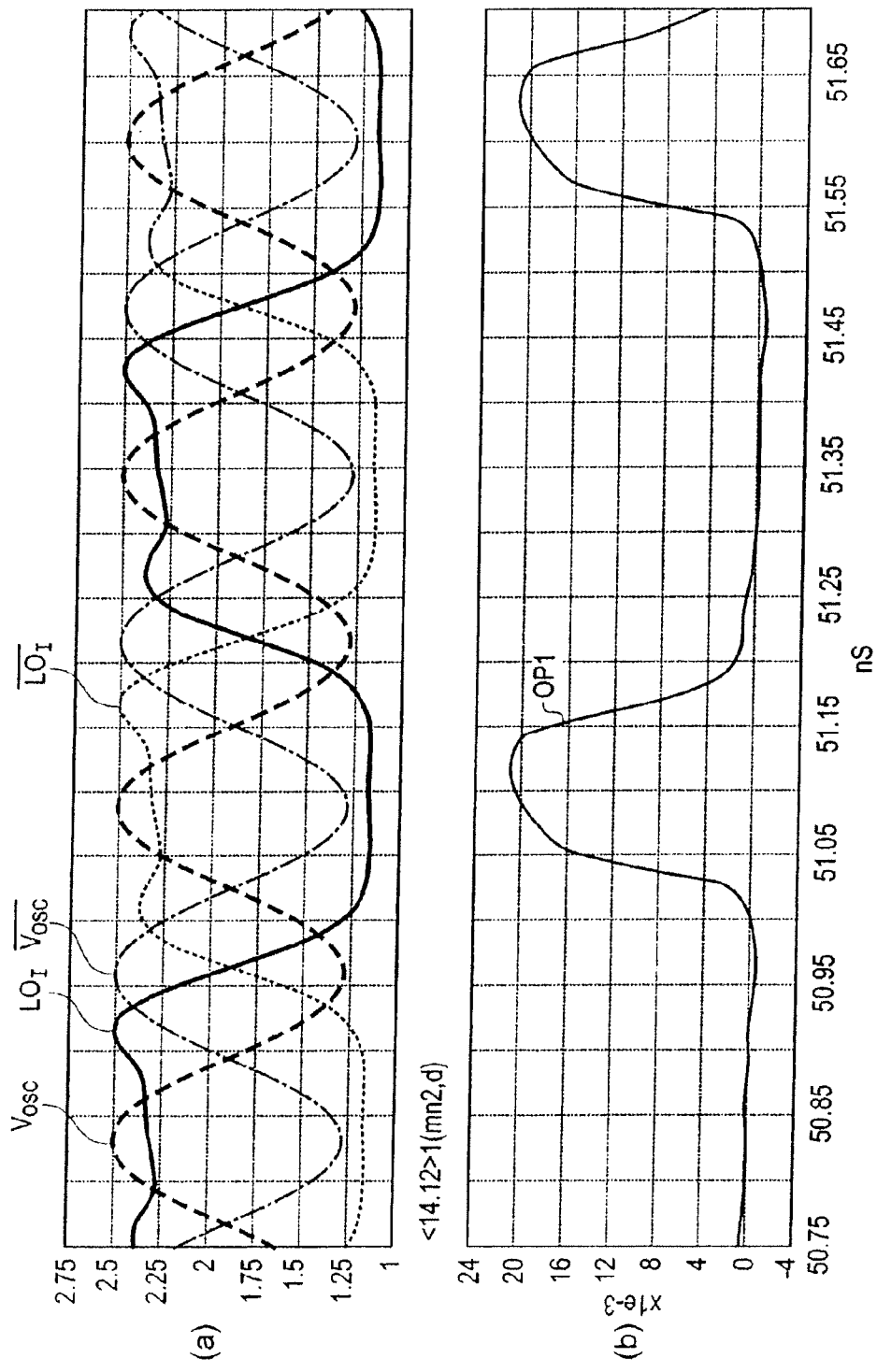
FIG. 5 shows simulated waveforms for the modulator shown in FIG. 3.

FIG. 5a shows simulated waveforms for the signal $V_{OSC}$, $\overline{V_{OSC}}$, $LO_I$ and $\overline{LO_I}$ for an exemplary circuit operating at 4 GHz. At these frequencies $V_{OSC}$ and $\overline{V_{OSC}}$ are substantially sinusoidal in nature. It can also be seen that the transitions in signals $LO_I$ and $\overline{LO_I}$ take approximately 100 ps. However the current flow at the output node OP still exhibits low phase noise. The current waveform shown in FIG. 5b represents the drain current of transistor 92 in FIG. 3 or in FIG. 6.

Figure 6:
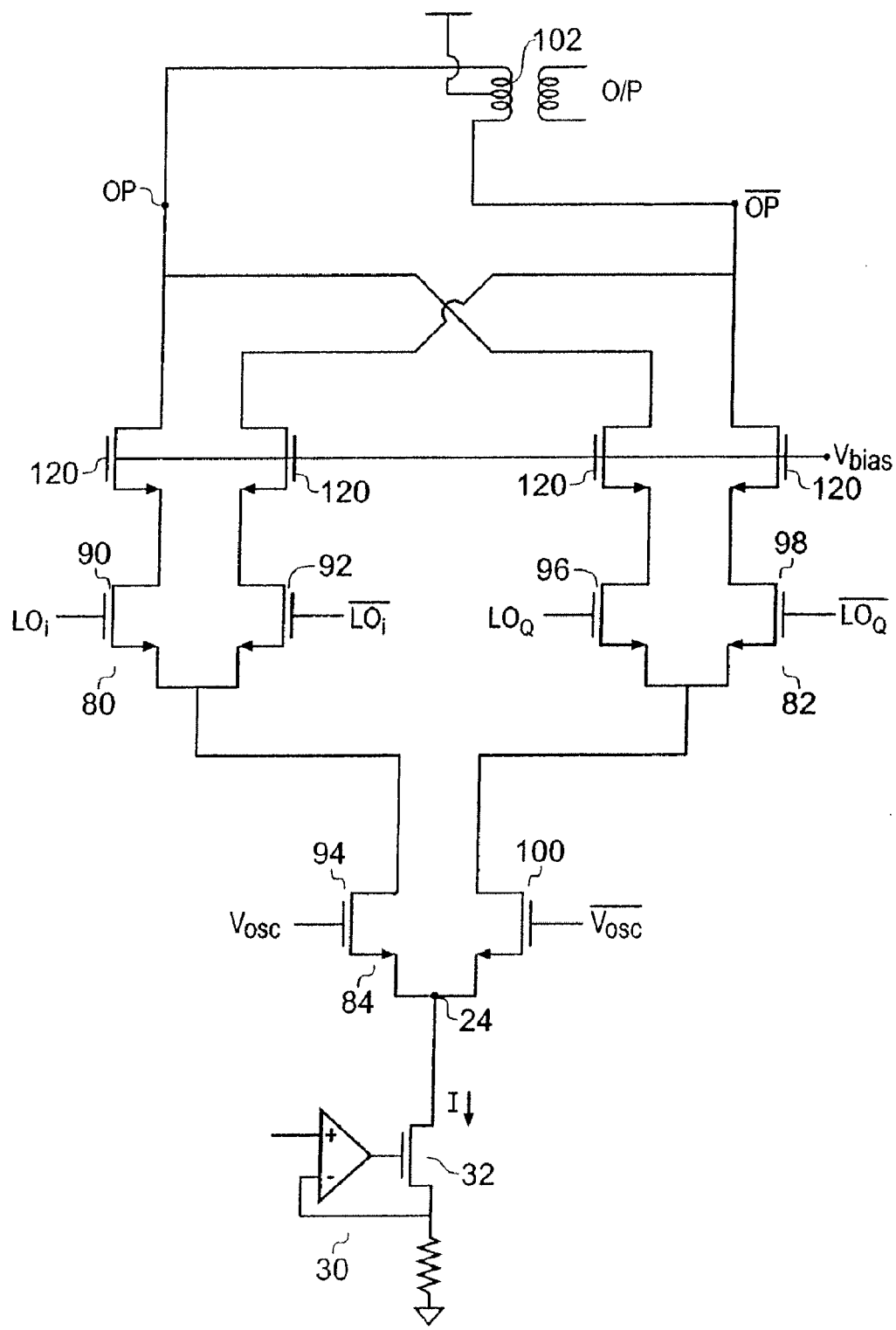
FIG. 6 shows a variation to the modulator core of FIG. 3.

In practice, the arrangement of FIG. 3 is modified by the inclusion of cascode transistors 120, as shown in FIG. 6, which serve to de-couple the performance of the switching transistors 90, 92, 96 and 98 from changes in the supply voltage or output voltage which might be due to other sections of the modulator.

Figure 7:
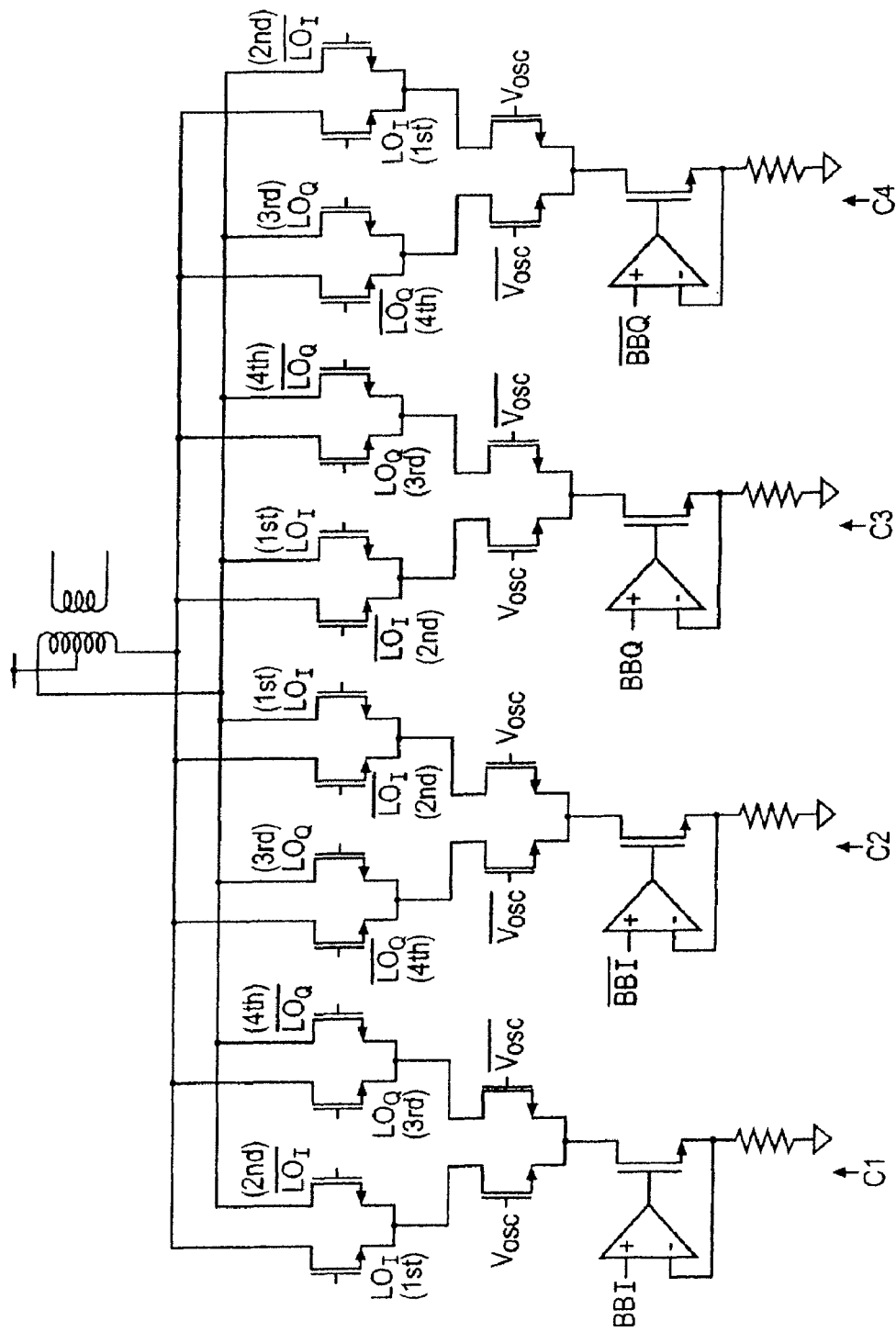
FIG. 7 shows an I-Q modulator using four modulator cores of the type shown in FIG. 3.

FIG. 7 schematically illustrates an I-Q modulator using four switching circuits labelled C1 to C4 of the type shown in FIG. 6, but with the cascode transistors omitted for clarity. Each transistor has its associated driving signal, $LO_I$, $\overline{LO_I}$, $LO_Q$, $\overline{LO_Q}$, $V_{OSC}$ or $\overline{V_{OSC}}$ indicated against its gate electrode. In use the base band signals to be up-converted are constrained to lie within well defined ranges. Therefore, if the base band signal BBI was constrained to lie between 1 and 2 volts, then $\overline{BBI}$ would also be constrained to lie between 1 and 2 volts with, $\overline{BBI}$ having a value of 2 volts when BBI had a value of 1 volt. The sum of BBI and $\overline{BBI}$ may typically be a constant although it is possible to reduce power consumption by altering the common-mode bias of these signals in such a way as to minimise the quiescent current of the circuit, and so long as the differential voltage is kept proportional to the desired input signal, this does not alter the operation of the circuit. Similar considerations apply to BBQ and $\overline{BBQ}$. Thus the input signal BBI and $\overline{BBI}$ can be considered as a differential input signal superimposed on a common-mode bias voltage.

Figure 8:
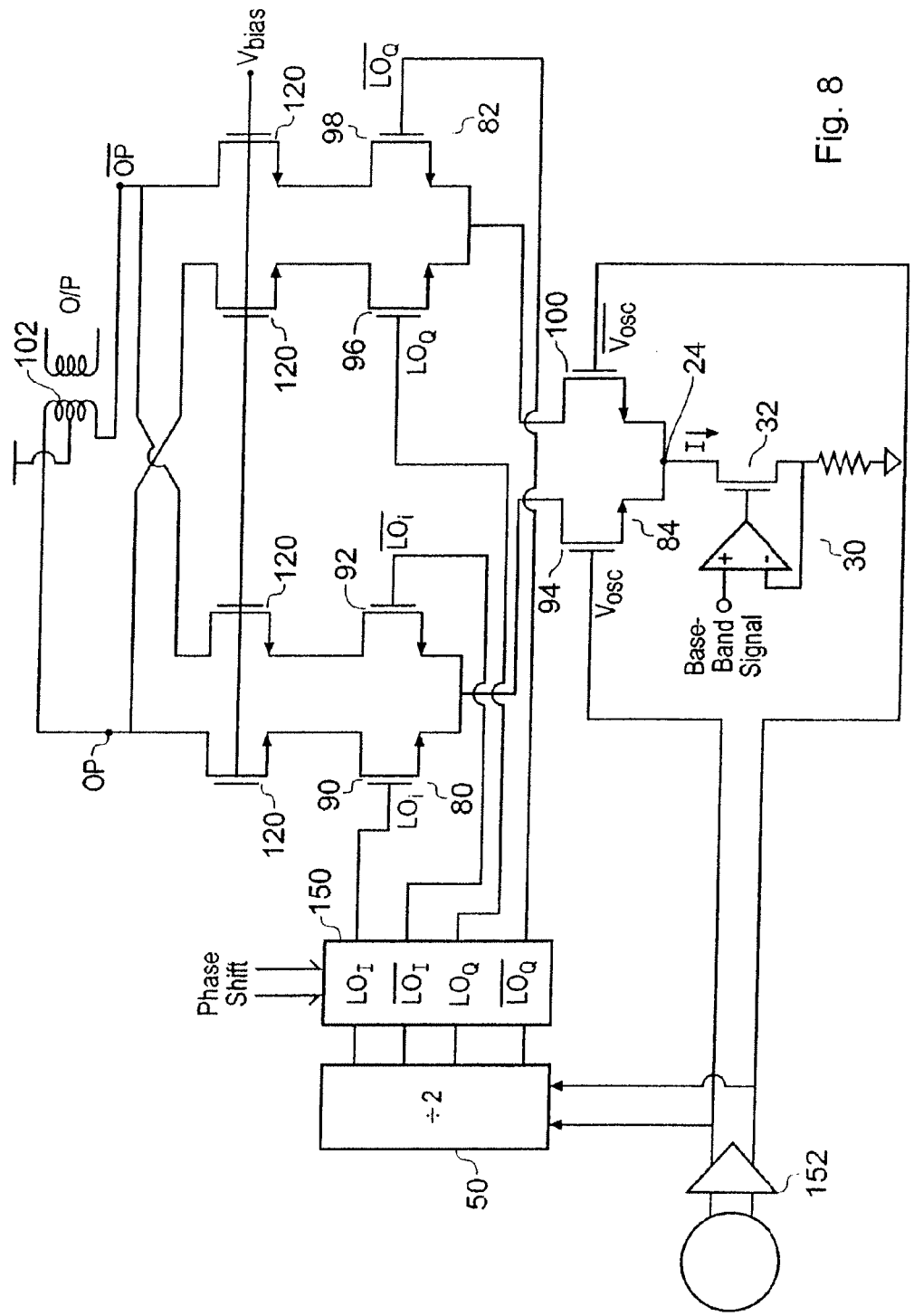
FIG. 8 shows a modulator core as shown in FIG. 3 or as part of the modulator shown in FIG. 7 in conjunction with a digitally controlled phase shifter.

Referring back to FIG. 4, it is apparent that the local oscillator signals $LO_I$, $\overline{LO_I}$, $LO_Q$ and $\overline{LO_Q}$ need to be in the correct phase or timing relationship with respect to $V_{OSC}$ and $\overline{V_{OSC}}$ for the invention to work correctly. The circuit designer could, of course, design the divide by two circuit and any buffers interposed between the divide by two circuit 50 and the switching transistors in order to ensure that, over an expected temperature range and voltage range that the signals were appropriately timed with respect to one another in order to ensure operation of the circuit. However an alternative approach is to measure the relative phases and use a phase shifting circuit 150 to adjust the phases as appropriate. Such an arrangement is shown in FIG. 8. The phase shift 150 has been drawn as being interposed between the divide by two circuit and the steering or switching transistors 90, 92, 96 and 98. A single phase shifting circuit 150 can be used to supply all of the switching transistors. The phase shifting circuit 150 could equally have been interposed between a buffer amplifier 152 which acts to buffer the oscillator signal and the divide by two circuit 50. The phase shift 150 can be controlled in response to a digital word and may be implemented in the digital domain by switching buffers into and out of the signal propagation path. Each buffer may be composed, for example, of two inverters arranged in series with a capacitor connected at a node between the inverters so as to introduce a relatively well defined propagation delay through the buffer. The phase shift could also be achieved by summing different proportions of the signals input to the phase shifter, and filtering the resulting signal.

Figure 9:
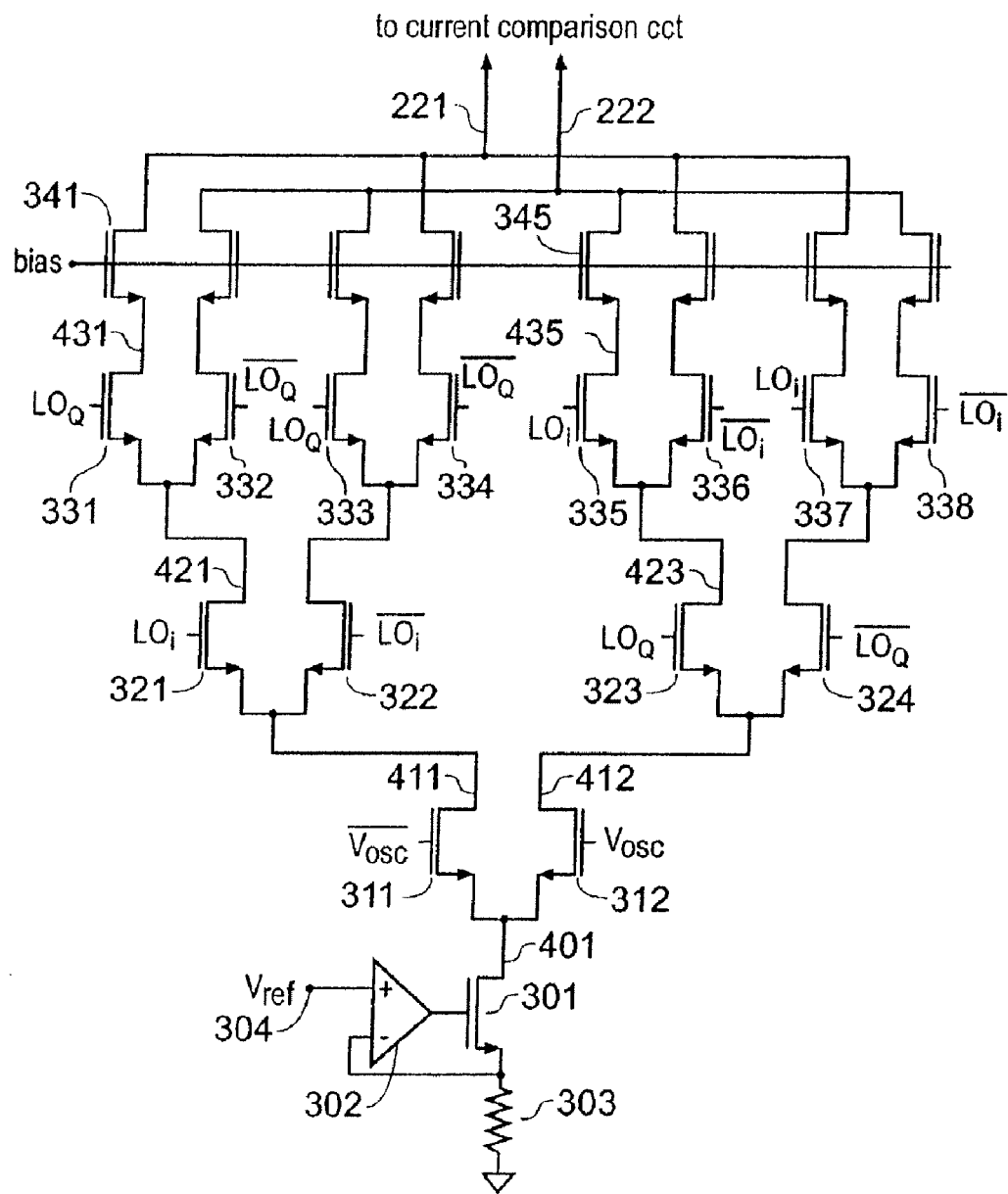
FIG. 9 shows the circuit diagram of a measurement circuit for determining the relative phases between the LO signals and transitions in $V_{OSC}$.

Having provided a digitally controllable phase shifter for shifting the phase, it then becomes desirable to be able to determine a relative timing between, for example, the transitions on $LO_I$ and $V_{OSC}$ in order to determine what phase shift should be implemented. FIG. 9 schematically illustrates a circuit of a timing detector which can be used to determine whether the phase relationship is correct or not. The timing detector can be used as part of the feedback loop in which the adjustable phase shifter 150 is used to vary the phase until such time as the timing detector determines that the correct phase relationship has been achieved.

The topology of the circuit shown in FIG. 9 is very similar to that of a modulator switching circuit as, for example, shown in FIG. 6. In particular, the structure formed by transistors 311, 312, 321, 322, 323, 324 is almost identical to the circuit of FIG. 6, however the connections to the driving transistors are modified such that under the desired operating condition, the transistors 321, 322, 323 and 324 do switch when they are carrying current, as the connections of $V_{OSC}$ and $\overline{V_{OSC}}$ have been reversed when compared to FIG. 6.

However, comparing the circuit of FIG. 9 with that of FIG. 6 (or the simplified version of FIG. 3 where the cascode transistors are omitted) we see transistor 90 of FIG. 6 corresponds to transistor 321 of FIG. 9. However whereas transistor 90 was in direct connection with the output terminal, via the cascode transistors which are always biased on, the equivalent transistor 321 of FIG. 9 is connected to a further long-tail pair formed by transistors 331 and 332. The sources of transistors 331 and 332 are connected to the drain of transistor 321. The drain of transistor 331 is connected to a first output node 221 via an intervening cascode transistor 341. The drain of transistor 332 is connected to a second output node 222 via an intervening cascode transistor. Transistor 331 receives the $LO_Q$ signal at its gate whereas transistor 332 receives the $\overline{LO_Q}$ signal.

This configuration is repeated, so transistor 322 connects to the sources of transistors 333 and 334. Transistor 333 receives the $LO_Q$ signal and is connected to the second output 222. Transistor 334 receives the $\overline{LO_Q}$ signal and is connected to the first output 221.

Transistor 323 is connected to transistors 335 and 336. Transistor 335 receives the $LO_I$ signal and is connected to the second output 222. Transistor 335 receives the $\overline{LO_I}$ signal and is connected to the first output 221.

Transistor 324 is similarly connected to transistor 337 which receives the $LO_I$ signal and is connected to the first output 221, and transistor 324 is also connected to transistor 338 which is connected to the second output 222 and receives the $\overline{LO_I}$ signal.

An operational amplifier 302 controls MOSFET 301 in such a way as to develop across resistor 303 a voltage which is equal to a reference voltage 304. This causes a constant current to flow in a conductor 401 and hence through the long tail pair formed by transistors 311 and 312. During the time that $V_{OSC}$ is more positive than $\overline{V_{OSC}}$, the current in conductor 401 will also flow through conductor 412, whereas during the time that $V_{OSC}$ is more negative than $\overline{V_{OSC}}$, the current will flow through conductor 411. Therefore the difference between the currents in the conductors 412 and 411 will have the same sign as the difference between the voltages $V_{OSC}$ and $\overline{V_{OSC}}$. Now consider the signals $LO_I$, $\overline{LO_I}$, $LO_Q$, and $\overline{LO_Q}$. When $LO_I$ is more positive than $\overline{LO_I}$, and $LO_Q$ is more positive than $\overline{LO_Q}$, then, working upward through FIG. 9 any current in conductor 411 will pass through MOSFET 321, conductor 421, MOSFET 331, conductor 431 and the Cascode MOSFET 341, and will finally pass through conductor 221 at the top of the diagram. Similarly, any current which flows through conductor 412 will also flow through MOSFET 323, conductor 423, MOSFET 335, conductor 435, Cascode MOSFET 345 and finally conductor 222 at the top of the diagram. It may be observed therefore that the currents in 412 and 411 respectively appear at conductors 222 and 221. If the signals $LO_I$ and $\overline{LO_I}$ change their logic states, then this will have the effect of swapping over the current paths so that whatever current was flowing in conductor 221 is now flowing in conductor 222, and vice versa. Similarly, swapping the logic states of $LO_Q$ and $\overline{LO_Q}$ will also have the effect of swapping over the currents in conductors 221 and 222. FIGS. 10a to 10d show the relative phases of the $LO_I$, $\overline{LO_I}$, $LO_Q$ and $\overline{LO_Q}$ signals, and FIG. 10e shows the differential output current that would occur at the outputs 221 and 222 if $V_{OSC}$ was a constant DC signal. However $V_{OSC}$ also oscillates, as shown in FIGS. 10f and 10g and as a result a differential output current, as shown in FIG. 10h, occurs. Therefore the final result is that at any instant in time, the difference in the currents in conductors 222 and 221 has the same sign as the voltage difference between the signals $V_{OSC}$ and $\overline{V_{OSC}}$ multiplied by the sign of the voltage difference between $LO_I$ and $\overline{LO_I}$ multiplied by the sign of the voltage difference between $LO_Q$ and $\overline{LO_Q}$. This is equivalent to the logic function known in the field of digital logic as a three—input exclusive-OR gate.

Figure 10:
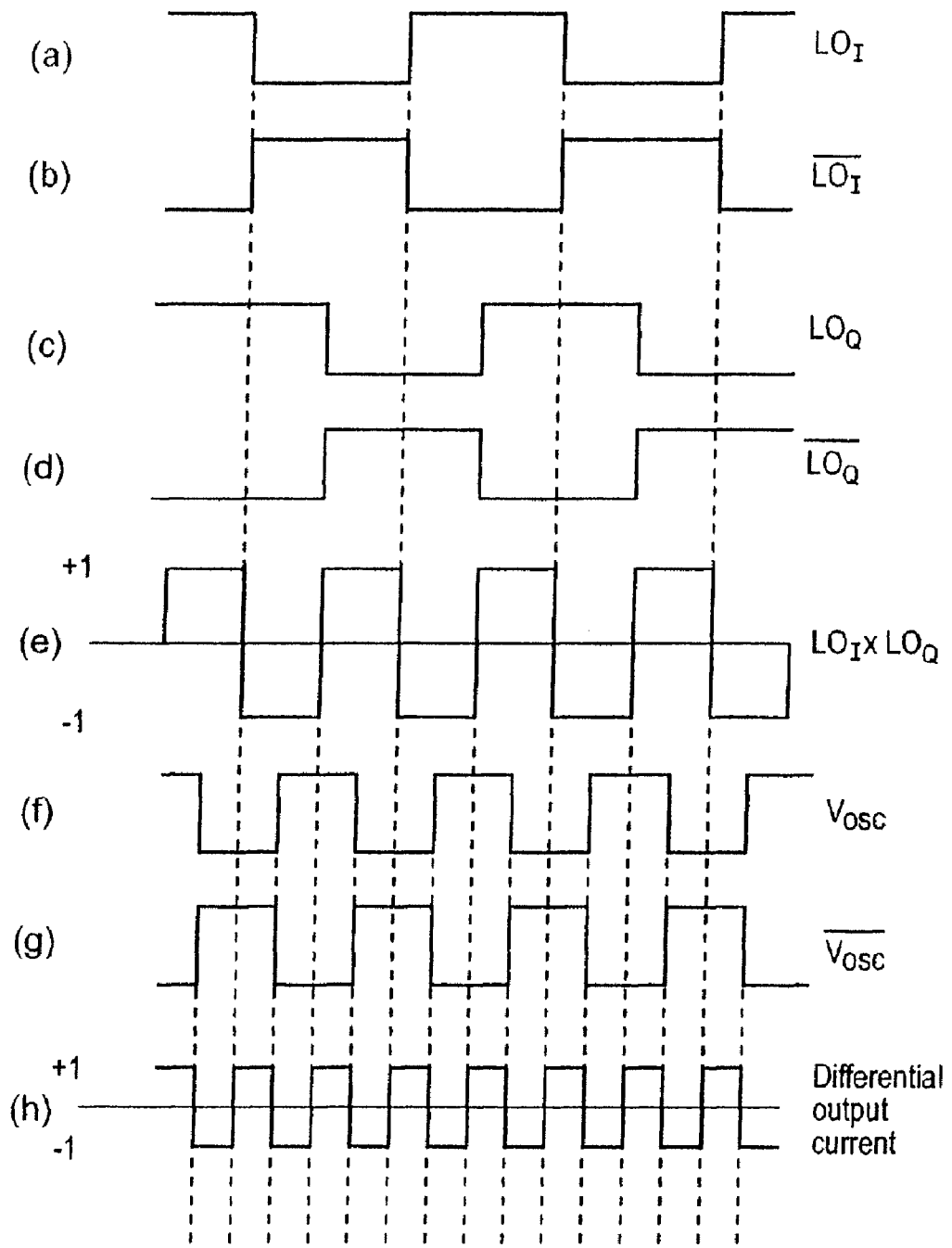
FIG. 10a to 10h are timing diagrams illustrating the relative timings of signals within the phase measuring circuit of FIG. 9.

When the local oscillator signals $LO_I$, $\overline{LO_I}$, $LO_Q$ and $\overline{LO_Q}$ are aligned with $V_{OSC}$ as shown in FIGS. 4 and 10, then the integrated average of the currents flowing at nodes 221 and node 222 are the same. However if the phase relationship starts to drift then the current flowing out of one node becomes greater than the current flowing out the other node and a non zero average differential output current results. The sign of the differential current can be detected and used in a feedback loop to vary the propagation delay/phase shift provided by the phase shifter 150. The feedback or search for the optimal phase could also be controlled digitally, for example, by a state machine.

The modulator according to the present invention exhibits several advantages over the prior art due to the fact that the transistor pairs which are controlled by the divider are never conducting current when they are switched. Thus the modulator is insensitive to phase noise or jitter in the divider and the exact timing of the transitions of the output waveforms of the divider circuit becomes relatively unimportant.

Computer simulations have suggested that the noise spectral density of a modulator constituting an embodiment of the present invention should be around −166 dBc/Hz at an offset of 190 MHz when transmitting +2 dBm to a power amplifier, whereas a prior art arrangement including a buffer amplifier required to increase the modulator output power to +2 dBm would be expected to have a noise spectral density of around −145 dBc/Hz or about 21 dB worse.

The insensitivity to timing errors in the divider signals also extends to fixed errors in the switching time which, in the modulator described herein are unimportant for the same reason as random jitter is unimportant, but which are troublesome in traditional direct conversion modulators because they would introduce "quadrature error". In other words, in a prior art modulator afflicted with timing errors in the LO signals, the component of the RF output signal due to the in-phase base band channel is not truly at 90° with respect to the RF output signal due to the imaginary base band channel. Such systematic timing errors can easily be introduced by parasitic capacitance in the layout of a circuit unless extreme care is taken. However, in the present invention, to achieve good quadrature it is only necessary that the two anti-phase signals which drive the lower switching transistors at double the transmit frequency ($V_{OSC}$ and $\overline{V_{OSC}}$) are symmetrical with equal and opposite swing and a 50% duty cycle, which is a requirement that is equally present at the input the divide by two circuit of a conventional modulator.

It is often useful to be able to control the output power of a modulator, and thereby control the output power of a transceiver. Indeed, in a wide band code division multiple access (W-CDMA) mobile telephone handset (such as used in the so-called 3G systems) it is necessary to be able to vary the output power of the handset's transmitter over a very wide range. In one such system the output power should be adjustable up to +24 dBm (0.25 W) and down to −50 dBm (0.00000001 W). The modulator core described hereinbefore is particularly suited for use in a transmitter required to produce this power output range.

The embodiments of the modulator described herein have been shown, in general, driving a centre tapped transformer, although it should be appreciated that other output circuits could also be driven. It is also possible to separate the drain terminals of the four transistors labelled 120 in FIG. 6, and to connect these to a load through phase shifting networks or delay lines in order to increase the available output power. The phase of the fundamental component of the output current from the four transistors labelled 120 in FIG. 6 is 0, 180, 90 and 270 degrees relative to some arbitrary reference, and so in FIG. 6, the currents at 0 and 90 degrees are summed, and the currents at 180 and 270 degrees are summed, and then these two sum currents are applied as the differential input to a balun. It should be appreciated that by individually shifting the four currents from the drains of the transistors 120, to be in phase with one another, more output power would be available. It is also possible to use to one's advantage the fact that the four output currents from the transistors 120 of FIG. 6 are not in phase, and this may be particularly useful in a down-converting mixer of a direct conversion receiver or in up-converting to create a pair of quadrature signals as are required to drive some forms of power amplifier.

Figure 11:
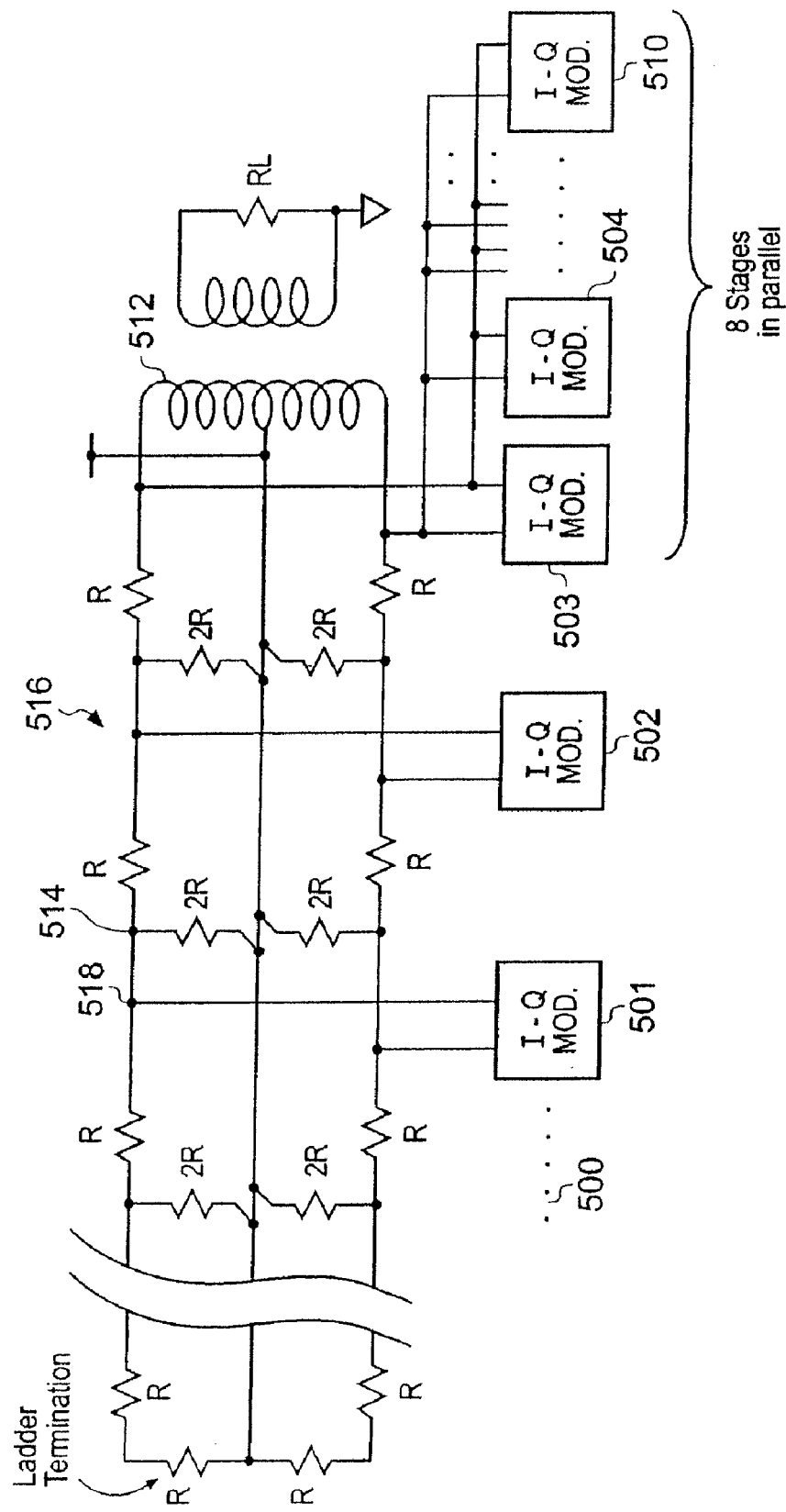
FIG. 11 is a schematic diagram of a modulator having a variable power output and constituting an embodiment of the invention.

FIG. 11 represents an arrangement in which a plurality of IQ modulators, each for example being of type shown in FIG. 7 and for simplicity designated 501, 502, 503, 504 and 510 are provided in parallel. Eight modulators 503 to 510 are connected directly in parallel with one another and to a centre tapped transformer 512. Any one or more of the cores 503 to 510 can be switched on or off thereby giving an output amplitude range of 8 to 1, hence an output power control range of 64 to 1, which corresponds to a control range of 18 dB. As shown in FIG. 11, further IQ modulators 502, 501 and optionally additional modulators as represented by the chain line 500 are connected to the centre tapped coil 512 by way of a R-2R ladder, generally designated 514. The R-2R circuit is well known and need not be described further. However, the first modulator 502 connected at a first tap 516 in the ladder 514 only delivers half the output voltage amplitude to centre tapped coil that it would have delivered had it been directly connected to the coil. Therefore there is a 6 dB reduction in the output power from the modulator 502 compared, for example, to the modulator 503. The next modulator, 501, connected at the second tap 18 has its output power attenuated by 12 dB compared to the modulator 503. In general, each tap in the R-2R ladder gives a further 6 dB of attenuation by the time the signal reaches the centre tapped coil 512. In a preferred embodiment 7 taps are provided in the R-2R ladder and 7 modulators are connected to these taps. Therefore the end most modulator has its power output attenuated by 42 dB compared to modulator 503. By switching one or more of the modulators along the R-2R ladder, power steps of 6 dB can be achieved, giving an overall power range of some 60 dB. However, it should be noted that modulators need not be attached at every one of the taps thereby giving rise to 12 dB step sizes instead of 6 dB, at some places along the power range, in return for a greater power range for a given number of modulator cores.

With conventional direct conversion transmitters it is difficult to produce a good modulated signal at very low power levels because of coupling of the local oscillator signals into the output signal of the transmitter, for example through mismatches in the parasitic capacitance of the switching transistors within the modulator. The fixed amount of local oscillator signal present in the output waveform due to coupling is an unwanted product of the modulator and when the transmitter power is sufficiently reduced the LO leakage could be comparable in power to the wanted output signal. In the arrangement shown in FIG. 11 this problem can be solved by switching off the LO waveforms on each section of the modulator if that section is not being used. Thus, for example, if one of the modulator cores attached to a tap of the R-2R ladder were being used, then the LO signals to that core would be present but the LO waveforms would be switched off for every other section which was not in use. By this means the LO leakage is reduced by the same amount as the wanted transmit signal so the ratio between the two is always acceptable.

When an amount of output power is required that does not correspond exactly to one of the taps along the resistive R-2R ladder, but is somewhere in between the power levels of two adjacent taps then the desired output level can be achieved by selecting the tap which results in the greater output power and by reducing the amplitude of the base band signals applied to the modulator. It is quite possible to use this approach for controlling the output power by adjusting the base band amplitude over a small range of power.

Figure 12A:
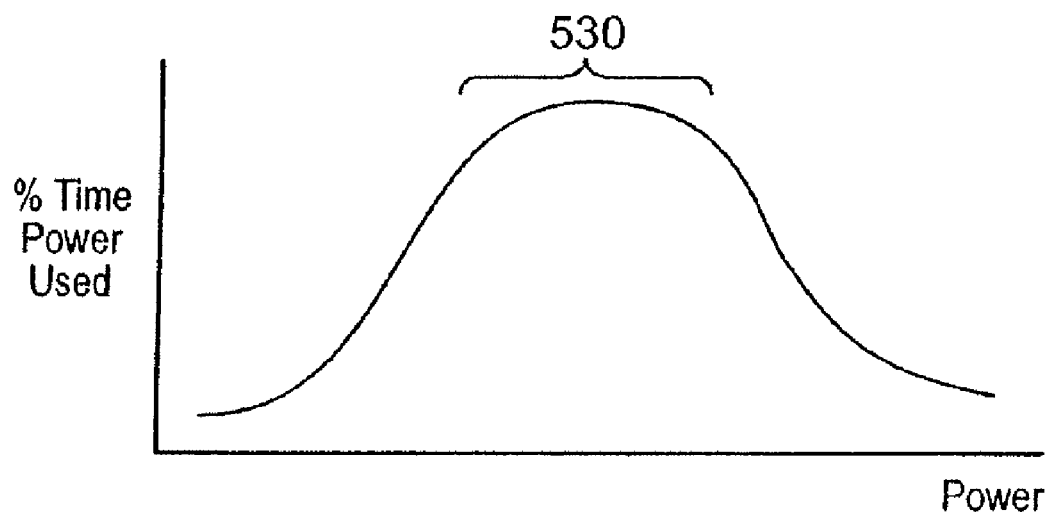
FIGS. 12a and 12b show a histogram of power output for a typical hand held transmitter and its associated power cost to run the modulator.
Figure 12B:
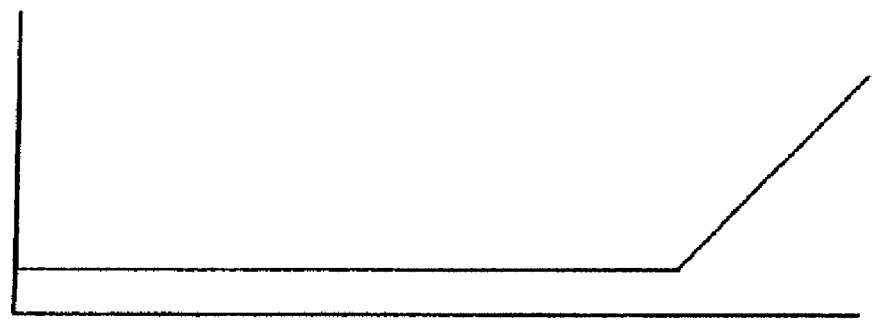

A further advantage of the present invention is that for most of the time the output power required by the transmitter can be serviced by only one of the IQ modulator cores being switched on. This is shown schematically in FIG. 12 where FIG. 12a is a histogram representing the proportion of the time that a transceiver will be required to output a given power, against the transceiver power. It can be seen that the transceiver operates only infrequently in both its lowest power mode and its highest power mode and would predominantly operate in the middle of its power range, generally designated 530. FIG. 12b shows the power budget for the transceiver as the function of power and it can be seen that for most of the time only one of the IQ modulators needs to be powered up. Its only in the final 18 dB of power output that two or more of the modulator cores need to run in parallel.

Many mobile telephone handsets are required to transmit in several widely different ranges of frequencies. Typically some of the frequencies are around 900-1000 MHz, and some others of the frequencies are around 1800 to 2000 MHz. In such a handset it is desirable to use the same frequency synthesiser for both the transmit frequencies. However a tuning range of most practical synthesisers covers much less than the 2:1 range of frequency described above. A simple way to halve the transmit frequency when for example operating in 1000 MHz range, is to insert a new frequency divider in the path of the local oscillator to the modulator. When this divider is not required, for example when transmitting in the higher frequency range, it can be bypassed. Unfortunately any additional divider produces additional jitter in the switching points of the switching transistors and this is undesirable. The divider can be made to be low-noise (quiet) meaning that it introduces little extra phase noise but this is only at the expensive of consuming a great deal of power within the divider.

Figure 13A:
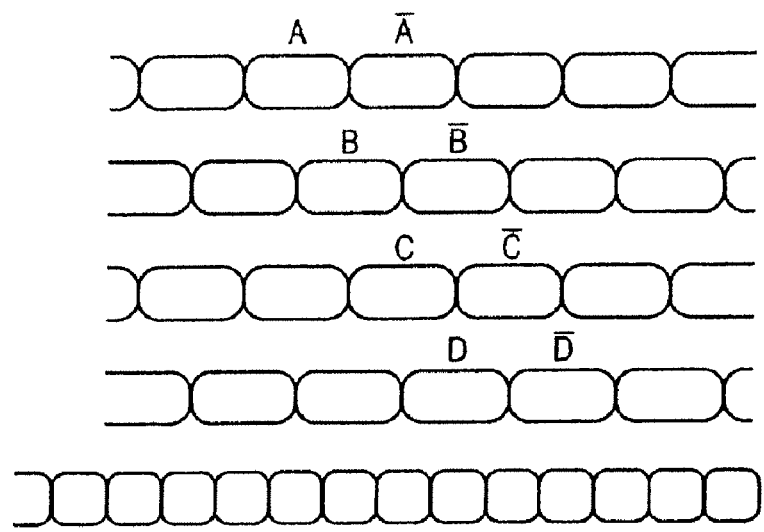
FIGS. 13a and 13b show timing diagrams for a modulator operable in two frequency ranges roughly one octave apart.
Figure 13B:
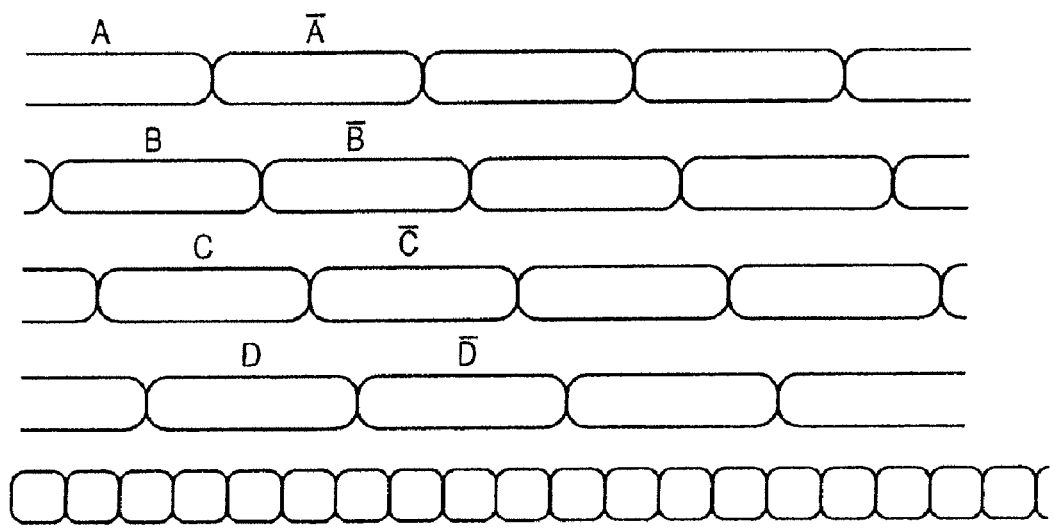

When using a modulator according to the present invention, there is a alternative and superior approach available for transmitting at the lower frequencies. In this instance, the $V_{OSC}$ and $\overline{V_{OSC}}$ signals can be left running at the same high frequency as in the original case, but only the gate drive waveforms of the switching transistors in the modulator are altered. Such a condition is shown in FIGS. 13a and 13b. FIG. 13a shows the relationship between $LO_I$, $\overline{LO_I}$, $LO_Q$ and $\overline{LO_Q}$, and the $V_{OSC}$ signal when operating in a "high" frequency band where the LO signals are at half the frequency of $V_{OSC}$. In fact each of the $LO_I$, $\overline{LO_I}$, $LO_Q$ and $\overline{LO_Q}$ signals appears twice in FIG. 13, because this gives the facility to separate the control of some transistors in a way that also allows operation at lower frequencies. FIG. 13b shows an equivalent timing diagram where the $V_{OSC}$ is at the same frequency as before but the $LO_I$, $\overline{LO_I}$, $LO_Q$ and $\overline{LO_Q}$, signals have been replaced by eight switching signals which have been frequency divided again such that they are now at ¼ of the oscillator frequency. Thus a tunable 4 GHz oscillator can be used in a dual band telephone operating in the 800 MHz to 1000 MHz range and the 1800 MHz to 2000 MHz range. The frequency division need not only be divide by two or divide by four. The gate waveforms could be at ⅓ or some other fraction of the oscillator frequency. Under such circumstances the phase detection system requires modification.

Figure 14:
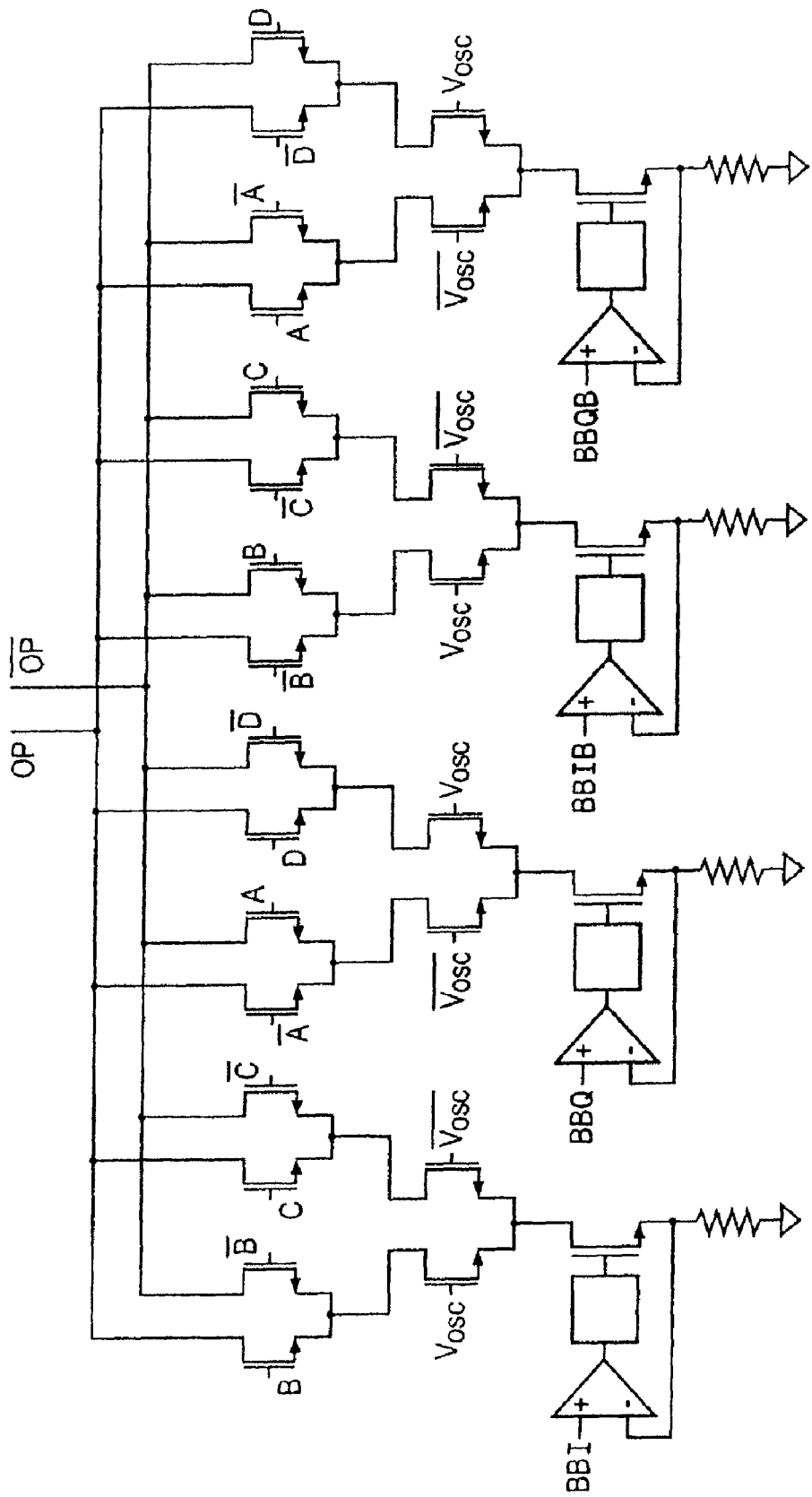
FIG. 14 shows the signal connections of FIGS. 13a and 13b to a modulator.

It can be seen in FIGS. 13a and 13b that the signals to the switching transistors have been designated A to D and $\overline{A}$ to $\overline{D}$. In FIG. 13a C corresponds to $\overline{A}$ and D corresponds to $\overline{B}$. In FIG. 13b the phasing has been changed such that B lags A by 45°, C lags A to 90° and D lags A by 135°. All of the complement signals $\overline{A}$ to $\overline{D}$ are also used, and their connections to the modulator is shown in FIG. 14.

Clearly the local oscillator waveforms and their components have to be generated at lower frequency for the low band operation, and by using extra flip flops which were not required for the high band only modulator, but these additional flip flops do not contribute to the phase noise at the output of the modulator since any jitter that they introduce into the timing of the switching of the switching transistors still occurs at a time when those transistors are not carrying current.

A further advantage of this approach is that, by not changing the frequency of $V_{OSC}$ and the $\overline{V_{OSC}}$ signals, they can be provided efficiently using a resonant circuit, including an inductor, which does not need to retuned when switching between the high and low bands.

Figure 15:
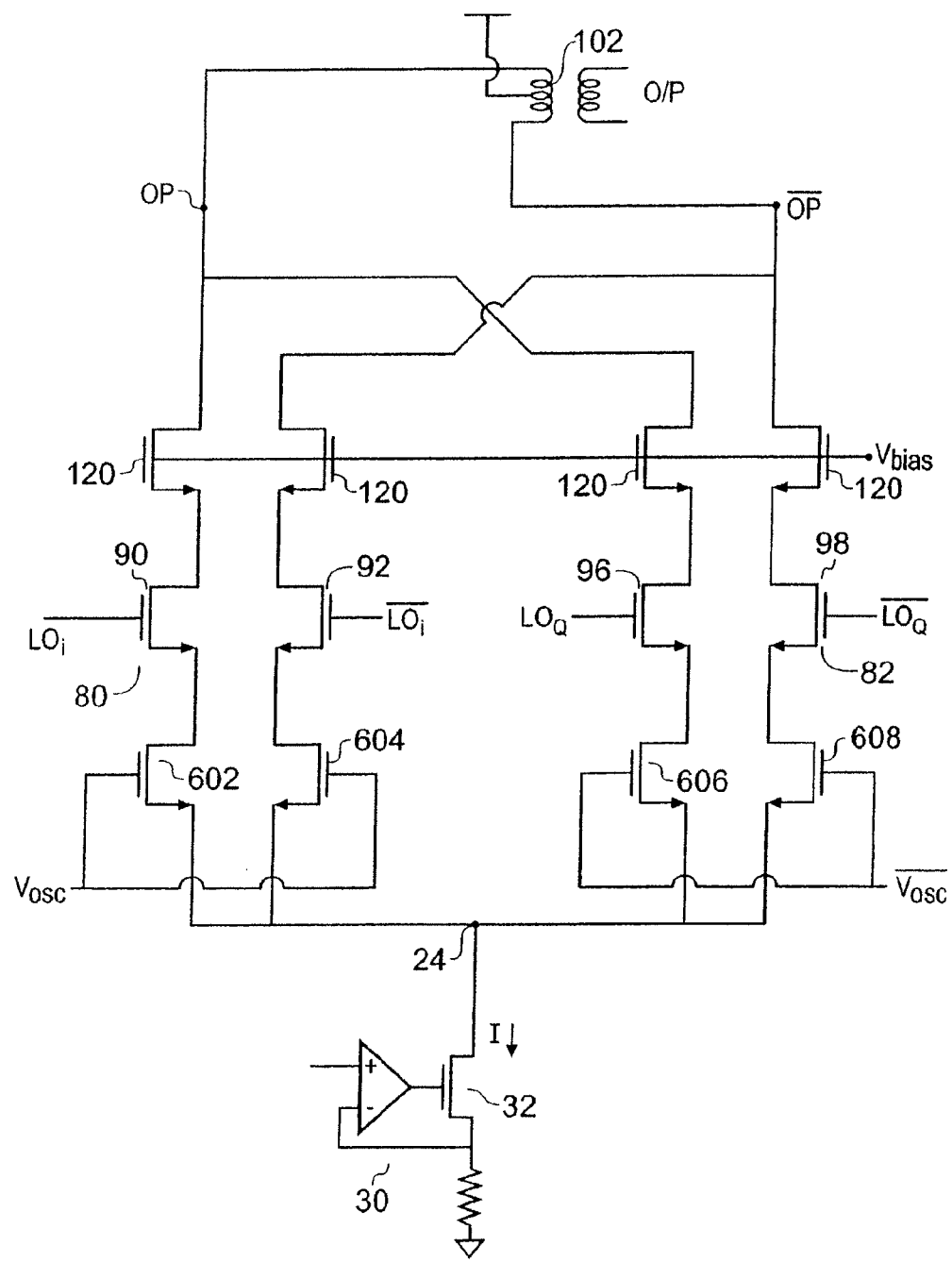
FIG. 15 shows a modification to the switching circuit of FIG. 6 and constituting an embodiment of the present invention.

Hitherto the current provided to the steering switches, for example transistors 90 and 92 as shown in FIG. 6 within any modulator switching circuit has been controlled by a single transistor, for example transistor 94 of FIG. 6. Similarly a transistor 100 controls the current supply to the transistors 96 and 98 within that Figure. However, this represents a special (simplified) example of a more generic case as shown in FIG. 15. Comparing FIG. 15 with FIG. 6, like components have been given identical reference numbers. However transistor 94 (a chopping transistor) which had previously been in series with both transistors 90 and 92 has been replaced by two individual transistors 602 and 604 with transistor 602 being in series connection with transistor 90 and transistor 604 being in series connection with transistor 92. The gates of transistors 602 and 604 are connected to a common terminal so as to receive the signal $V_{OSC}$. Similarly transistor 100 has been replaced by transistor 606 in series connection with transistor 96 and transistor 608 in series connection with transistor 98. The gates of transistor 606 and 608 are connected together and receive the signal $\overline{V_{OSC}}$. Therefore the circuit in FIG. 15 reproduces identically the functionality of the circuit shown in FIG. 6. However, this configuration can have more utility as a general purpose mixer. For example, it follows that because the transistor 90 receiving the local oscillator signal $LO_I$, and the transistor 602 receiving the switching signal $V_{OSC}$ are in series then their relative positions within the circuit can be changed. This may in some configurations be advantageous depending on the relative voltages/strengths of the driving signals as in may enable the cascode transistors 120 to be omitted from the circuit.

The switching circuit has so far been described in the context of a direct conversion transmitter. However it can also be used in conversion schemes where it is necessary or desirable to generate an intermediate frequency or where an intermediate frequency has already been generated. In such an arrangement an RF input signal is provided to the input stage 30. In such an arrangement, the circuit can be used as either an up-converter or down-converter.

Direct down-conversion receivers are becoming more prominent, and the circuit configuration of the present invention has significant advantages within this architecture. The arrangement shown FIG. 6, and consequently FIG. 15, is suitable with minor modification to act as a complete I-Q mixer. In such an arrangement the connections from the drains of the transistors 90, 92, 96 and 98, or from the respective cascode transistors 120 if they are maintained within the circuit, are connected directly to the positive supply rail via respective load resistors. Therefore the voltage occurring transistor 90 would be the I output, at above transistor 92 would be the Ī output at above transistor 96 would be the Q output and that above transistor 98 would the $\overline{Q}$ output. The circuit would work as described hereinbefore with respect to FIG. 4, so it can be seen that the input current which occurs at node 24, is switched to the I output, then to the Q output, then to the Ī output, and then to the $\overline{Q}$ output. This sequence then repeats.

Figure 16:
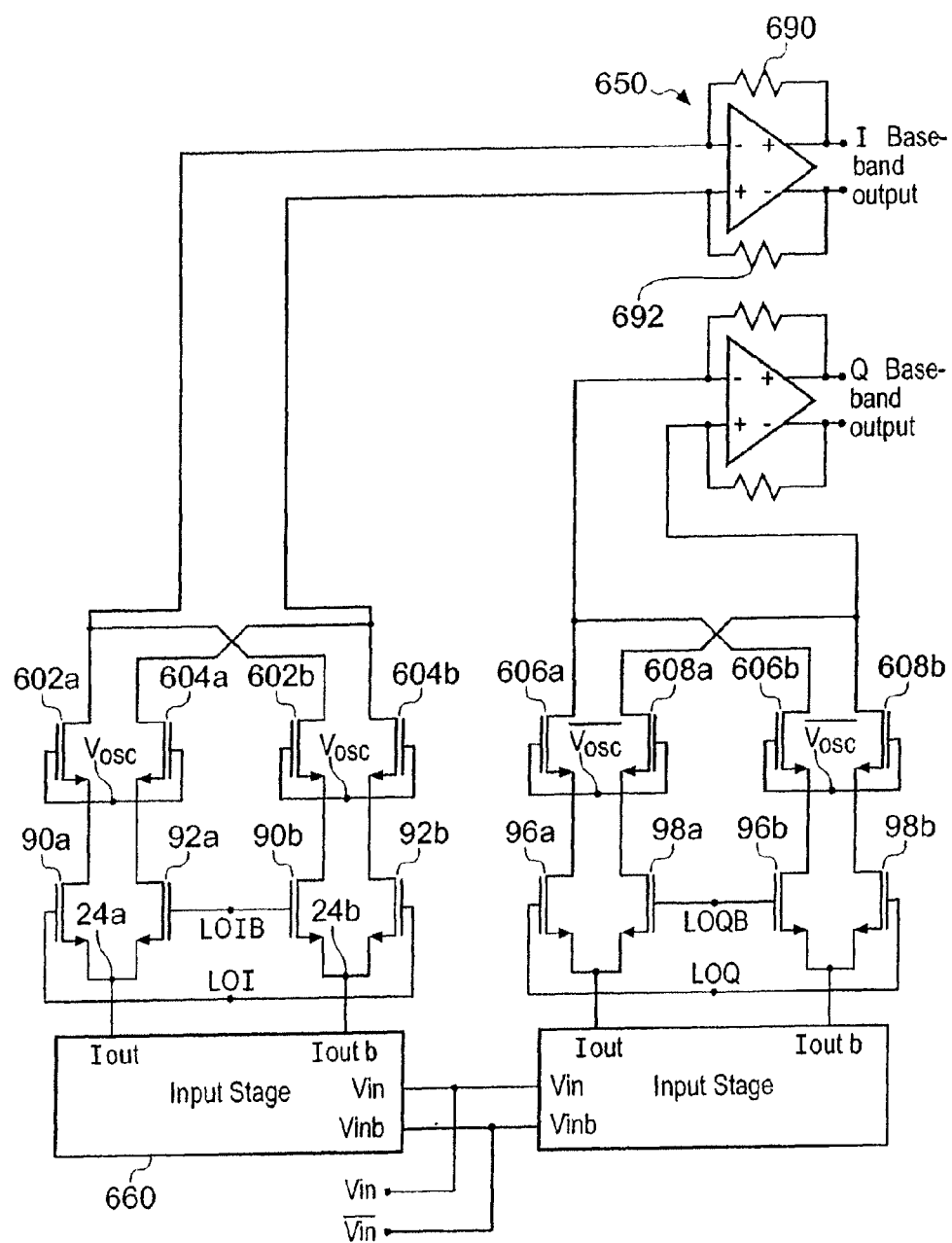
FIG. 16 shows a direct conversion demodulator constituting an embodiment of the present invention.

Frequently a designer wishes to use a differential input. If that is the case, then two mixer circuits are required, as schematically shown in FIG. 16. This circuit uses the basic topology illustrated and described hereinbefore with respect to FIG. 15, however given that it now has to handle differential currents, labelled $I_{OUT}$ and $\overline{I_{OUT}}$ then each path of the circuit has to be duplicated. In order to clarify this, the numbering system of FIG. 15 would be reused, but with those components which are carrying the $I_{OUT}$ current having a suffix "a", whereas those components which are dealing with the $\overline{I_{OUT}}$ current having a suffix "b". As can be seen from FIG. 16, the transistors 602a, 604a, 602b and 604b are provided with the $V_{OSC}$ signal which, as described hereinbefore, is generally at twice the frequency of the local oscillator signal $L_{OI}$ and $\overline{L_{OI}}$ supplied to the transistors 90a, 92a, 90b and 92b. A similar arrangement occurs in relation to transistors 606a and 606b, 608a and 608b, 96a and 96b, and 98a and 98b. For simplicity only the switching circuit on the left hand side of FIG. 16 will be described in detail. Transistors 602a and 602b have their drains connected together such that they feed to a common output node, which corresponds to the output OP of FIG. 15. Similarly transistors 604a and 604b have their drains connected together to form a common output node which corresponds to the output node $\overline{OP}$ of FIG. 15. however, in this arrangement, these nodes are connected to the inverting and non-inverting inputs of an operational amplifier 650 which has a feedback network formed around it.

The input currents to nodes 24a and 24b are provided by an input stage generally designated 660. The input stage may be a transconductance stage, for example as designated 30 in FIG. 15 but duplicated so as to be a differential stage, or it may be a stage as illustrated in FIG. 17 where the input stage is not a true transconductance stage and as a result lends the mixer/demodulator to being run as a "passive mixer".

Figure 17:
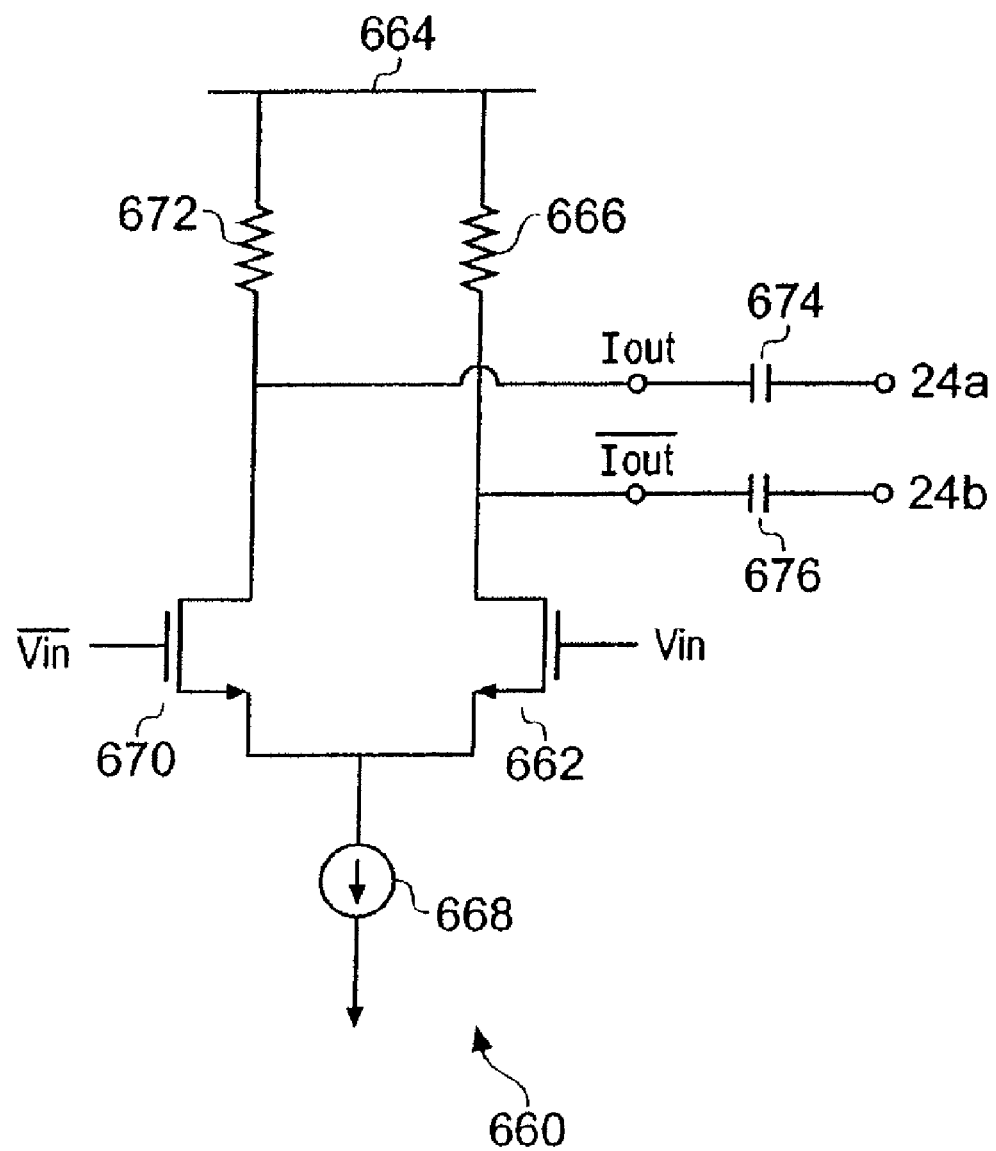
FIG. 17 illustrates an input stage for the demodulator.

Thus, with reference to FIG. 17, the input signal is a differential signal comprising complimentary input signals $V_{IN}$ and $\overline{V_{IN}}$. The $V_{IN}$ is provided at the gate of a transistor 662 whose drain is connected to a positive supply rail 664 via resistor 666 and whose source is connected to ground via a current sink 668, although this could be replaced by a resistor. The $\overline{V_{IN}}$ signal is provided to a transistor 670 whose drain is connected to the supply rail 664 via a resistor 672 and whose source is connected to the current sink 668. The current $I_{OUT}$ is available at the drain of the transistor 670, whereas the differential current $\overline{I_{OUT}}$ is available at the drain of the transistor 662.

If the circuit of FIG. 16 is to be run as a passive mixer, that is where the currents applied to the nodes 24a and 24b are only the signal currents and there is no superimposed bias current, then DC blocking capacitors 674 and 676 are inserted in the path to the nodes 24a and 24b. A passive mixer can exhibit good linearity and low noise.

The topology shown in FIG. 16 has advantages over prior art direct conversion receiver topologies (where transistors 602a and 602b, 604a and 604b, 606a and 606b, and 608a and 608b are omitted and replaced by short circuits). In particular, in any mixer there remains a possibility that, for example, transistors 90a and 92a will be conducting at the same time. The nature of the long tail pair configuration around transistors 90a and 92a makes it quite difficult, but not impossible, for them to be switched into a non-conducting state at the same time when they are being driven by complimentary (and generally sinusoidal) input signals. It can be seen that, during the switchover period, if both transistors 90a and 92a are not non-conducting then the inputs of the output amplifier 650 are effectively shorted together via a low impedance. This impedance will be much smaller than the value of the feedback resistors 690 and 692 and consequently during this transition period the amplifier 650 will function as a high gain amplifier. Therefore any noise present at the input stage of this amplifier will be subject to large amplification and then passed into the remainder of the receiver. This degrades the noise performance of the receiver. However, in receivers constituting embodiments of the present invention the transistors 602a and 604a are non-conducting whilst the transistors 90a and 92a are switching between their conducting and non-conducting states, respectively.

Figure 18:
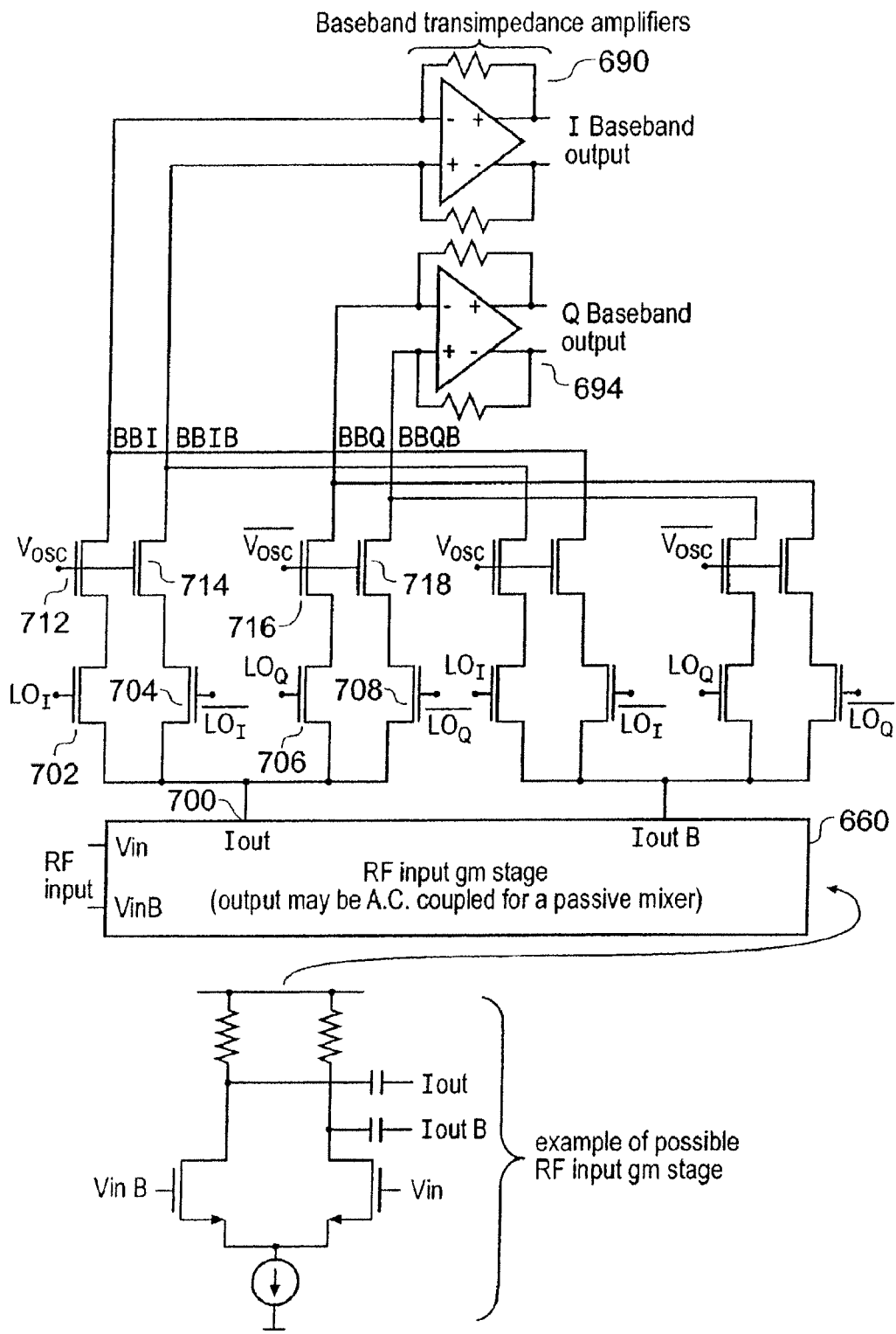
FIG. 18 shows an alternative direct conversion demodulator constituting an embodiment of the present invention.

Since the in-phase, I, channel of the of the local oscillator signal is switching during the period when Q channel of the local oscillator signal is not switching, and visa versa, the new transistors in the I channel switching pair will be non-conducting when the new transistors in series with the Q channel switching pair are conducting, and visa versa. This leads to the possibility of sharing a single input stage between the I and Q channels. Such an arrangement is shown in FIG. 18, it can be seen that current flow to the output amplifier 690 of the in-phase phase band output only occurs when $V_{OSC}$ is high and is inhibited when $V_{OSC}$ is low, when the current flow is to the Q channel output amplifier 694 instead. Although the current flowing from the mixer to the base-band amplifier contains high frequency components due to the rapid switching of the transistors within the mixer, it is possible to recover the base-band signal by simply low-pass filtering the output of the mixer.

This arrangement represents an improvement over the circuit of FIG. 16. Here the input stage 660 is always passing current in each of its $I_{OUT}$ and $\overline{I_{OUT}}$ channels. Consider the $I_{OUT}$ channel 700. It feeds current to transistors 702 and 704 which are driven in anti-phase by the $LO_I$ and $\overline{LO_I}$ signals, and also to the transistors 706 and 708 which are driven in anti-phase by the $LO_Q$ and $\overline{LO_Q}$ signals. The transistors 702 and 704 are in series with transistors 712 and 714 driven by the $V_{OSC}$ signal (which is generally at twice the frequency of $LO_I$ and timed such that signal transitions do not occur simultaneously—as described hereinbefore with respect to FIG. 4). Transistors 716 and 718 are in series with transistors 706 and 708 and are driven by the $\overline{V_{OSC}}$ signal. From this it follows that there is always a current flow path between the $I_{OUT}$ output 700 and one of the inputs of either the I channel amplifier 690 or the Q channel amplifier 694. The same analysis holds true for the $\overline{I_{OUT}}$ channel. Therefore this configuration can work in both a passive mixer mode (where there is no DC bias current) or in a active mode, where the input stage 660 is a true transconductance stage or is a modulated current source.

The transistor pairs 702, 712; 704, 714, etc are in series and hence can be in reversed order (702 above 712 in the circuit diagram) without altering the operation of the circuit.

It is thus possible to provide an improved modulator topology which exhibits improved phase noise performance. It is also possible to provide an improved demodulator.

It should be remembered that in most integrated circuit processing technologies, the physical construction of the drain of a MOS transistor is identical to the physical construction of the source. This means that when placing the transistor in the layout, if the drain and source terminals are exchanged, this will have no effect whatsoever on the operation of the resulting integrated circuit. Therefore any device or method which differs from this invention purely by the drain and source of one or more MOS transistors being exchanged must be recognised to be physically identical to the invention and therefore should be included within the scope of the present invention. Similarly, since we are using the transistors as switches because they are either hard on or hard off, then other switching technologies could also be used, such as bipolar devices.

The invention claimed is:

1. A switching circuit operable to reduce phase noise in an output of the switching circuit comprising:

first, second, third and fourth steering switches operable to make or break a path between first and second terminals thereof, and each steering switch further having a control terminal for controlling the switch, the first, second, third and fourth steering switches having their control terminals driven by first, second, third and fourth switching signals, respectively, provided by a frequency divider, the first, second, third and fourth switching signals having a first frequency and the second switching signal being in anti-phase with the first switching signal and the third switching signal being in anti-phase with the fourth switching signal, the first steering switch having at most one of its first, second and control terminals connected directly to a corresponding terminal of the second steering switch; and first and second chopping switches operable to make or break a path between first and second terminals thereof and each having a control terminal, the first chopping switch being connected in series with the first and second steering switches at a first common node, the first chopping switch receiving at its first terminal a baseband signal to be modulated and up-converted by the switching circuit and receiving at its control terminal a first switching control signal, and the second chopping switch is connected in series with the third and fourth steering switches at a second common node, the second chopping switch receiving at its control terminal a second switching control signal and the first and second chopping switches are connected at a third common node wherein, in a phase noise reducing mode, the control terminal of the first chopping switch is driven by the first switching control signal which has a frequency that is a multiple of the first frequency, the first switching control signal and the first switching signal having a relative phase relationship such that the first chopping switch is always non-conducting while the first and second steering switches are changing between being conducting and being non-conducting, and the second chopping switch is driven by the second switching control signal in anti-phase with the first switching control signal, the second switching control signal and the third switching signal having a relative phase relationship such that the second chopping switch is always non-conducting while the third and fourth steering switches are changing between being conducting and being non-conducting.

2. A switching circuit as claimed in claim 1, in which the first terminals of the first and second steering switches are connected to the first common node, and the second terminal of the first chopping switch is also connected to the first common node.

3. A switching circuit as claimed in claim 1, in which the first chopping switch comprises a first sub-switch and a second sub-switch, and wherein the first sub-switch is in series with the first steering switch and is driven by the first switching control signal; and the second sub-switch is in series with the second steering switch and is driven by a second switching control signal in phase with the first switching control signal.

4. A modulator including a switching circuit as claimed in claim 1, in which the modulator is adapted to receive an oscillator output signal from an oscillator and the oscillator output signal provides the first switching control signal and is frequency divided so as to provide the first and second switching signals, wherein these signals have a controlled phase relationship and the first and second switching signals have a frequency of $$\frac{1}{N}$$

of the switching control signal frequency where N is a positive integer greater than 1.

5. A modulator as claimed in claim 4, where the first and second switching signals have a frequency half that of the first switching control signal.

6. A switching circuit as claimed in claim 1, where the first to fourth steering switches are field effect transistors and the first and second chopping switches are field effect transistors each having a gate, a drain and a source, and wherein the drains of the transistors forming first and third steering switches are connected together at a first output node, the drains of the transistors forming the second and fourth steering switches are connected together at a second output node, the sources of the transistors forming the first and second steering switches are connected to the drain of the transistor forming the first chopping switch, the sources of the transistors forming the third and fourth switches are connected to the drain of the transistor forming the second chopping switch, and the sources of the transistors forming the first and second chopping switches are connected together at an input node.

7. A switching circuit as claimed in claim 6, and further including a divider circuit for receiving an oscillator output signal at an input of the divider circuit and adapted to produce the first switching signal and the second switching signal, and wherein the divider circuit is further adapted to generate third and fourth switching signals at the first frequency and where the third switching signal is nominally delayed with respect to the first switching signal by half a period of the first switching control signal.

8. A switching circuit as claimed in claim 1, further including:
a phase shifter for adjusting a timing relationship between the first to fourth switching signals and the first switching control signal,
a timing detector for determining whether the timing relationship is correct or not so as to determine whether to vary the phase shift introduced by the phase shifter.

9. A modulator including a switching circuit as claimed in claim 1, where the first to fourth steering switches and the first and second chopping switches form a first modulator core, and the modulator comprises a further modulator core having the same configuration as the first modulator core.

10. A modulator as claimed in claim 9, wherein:
within the second modulator core the first steering switch receives the fourth switching signal, the second steering switch receives the third switching signal, the third steering switch the second switching signal and the fourth steering switch receives the first switching signal, and wherein the second modulator has its first and second switching control signals swapped when compared to the first modulator.

11. A modulator as claimed in claim 9, further including third and fourth modulator cores having the same configuration as the first modulator core.

12. A modulator as claimed in claim 11, where
within the third modulator core the first steering switch receives the second switching signal, the second steering switch receives the first switching signal, the third steering switch receives the third switching signal and the fourth steering switch receives the fourth switching signal and the first and second switching control signals are connected identically to those in the first modulator core; and
within the fourth modulator core the first steering switch receives the fourth switching signal, the second steering switch receives the third switching signal, the third steering switch receives the first switching signal and the fourth steering switch receives the second switching signal, and wherein the first and second switching control signals are swapped when compared to the first modulator core.

13. An adjustable modulator having a controllable power output, comprising a plurality of modulator cores connected directly or indirectly to a common output, where an output power is adjusted by varying the number of modulator cores that are working concurrently, where each modulator core comprises at least one modulator switching circuit as claimed in claim 1.

14. An adjustable modulator as claimed in claim 13 where some of the modulator cores are connected to the common output via an attenuating device.

15. An adjustable modulator as claimed in claim 14, wherein the attenuating device comprises an R-2R resistor network.

16. A modulator comprising a switching circuit as claimed in claim 1.

17. A mixing cell driven by a frequency divider, the mixing cell comprising first to eighth field effect transistors:
the first, second, third and fourth transistors having their source terminals connected together and having their gates driven by signals approximating square or sine waves at a first frequency;
the gate of the first transistor being driven substantially in antiphase to the gate of the second transistor;
the gate of the fourth transistor being driven substantially in antiphase to the gate of the third transistor;
the fifth transistor having its source connected to the drain of the first transistor;
the sixth transistor having its source connected to the drain of the second transistor and having its gate connected to the gate of the fifth transistor;
the seventh transistor having its source connected to the drain of the third transistor;
and the eighth transistor having its source connected to the drain of the fourth transistor and having its gate connected to the gate of the seventh transistor;
and wherein, in use, the gates of the sixth and eighth transistors being driven by signals which approximate a square or sine wave, and which are in antiphase to each other, and which are at a frequency which is a multiple of the first frequency;
the waveform driving the fifth and sixth transistors is timed such that the fifth and sixth transistors are always substantially not conducting during the time when the difference between the gate voltages of the first and second transistors is changing in sign;
the waveform driving the gates of the seventh and eighth transistors is timed such that the seventh and eighth transistors are always substantially not conducting during the time when the difference between the gate voltages of the third and fourth transistors is changing in sign.

18. A demodulator comprising at least one mixing cell as claimed in claim 17.

19. A demodulator as claimed in claim 18 wherein an RF signal to be converted to a base-band signal is supplied to the sources of the first to fourth transistors.

20. A demodulator as claimed in claim 19, where the first frequency is substantially the same as the frequency of the RF signal.

21. A demodulator as claimed in claim 18, providing I and Q outputs.

22. A demodulator as claimed in claim 21, comprising two mixing cells, wherein the demodulator is a double balanced demodulator.

23. A method of operating a mixing cell, operable as a modulator, the mixing cell comprising:

first to sixth transistors;

the first and second transistors arranged to form a first differential pair by having their sources or emitters connected together, and associated with a third transistor for permitting or inhibiting current flow to the first and second transistors, the first transistor having at most one of its source/emitter, drain/collector, and gate/base connected directly to a corresponding terminal of the second transistor;

the fourth and fifth transistors arranged to form a second differential pair and associated with a sixth transistor for permitting or inhibiting current flow to the fourth and fifth transistors;

the method comprising:

1) switching on and off the third and sixth transistors by driving their gate or base terminals with periodic signals, wherein the third and sixth transistors receive at their source or emitter terminals a baseband signal to be modulated and up-converted by the mixing cell;

2) driving the first and second transistors with first and second switching signals, respectively, such that the second switching signal is in antiphase with the first switching signal and the first and second switching signals are at a first frequency;

3) driving the fourth and fifth transistors with third and fourth switching signals, respectively, at the first frequency, where the third switching signal is similar to but delayed with respect to the first signal by an amount of time equal to half the period of the switching signal driving the third and sixth transistors, and the fourth switching signal is in antiphase with the third signal and the third and fourth switching signals are at the first frequency, and where switching transitions for the first and second transistors occur during periods when the third transistor is non-conducting and switching transitions for the fourth and fifth transistors always occur when the sixth transistor is non-conducting, the third and sixth transistors being driven in anti-phase and at a second frequency which is twice the first frequency.

24. A switching circuit comprising:

first, second, third and fourth steering switches operable to make or break a path between first and second terminals thereof, and each steering switch further having a control terminal for controlling the switch, the first, second, third and fourth steering switches having their control terminals driven by first, second, third and fourth switching signals, respectively, provided by a frequency divider, the first, second, third and fourth switching signals having a first frequency and the second switching signal being in anti-phase with the first switching signal and the third switching signal being in anti-phase with the fourth switching signal, the first steering switch having at most one of its first, second and control terminals connected directly to a corresponding terminal of the second steering switch; and first and second chopping switches operable to make or break a path between first and second terminals thereof, the first chopping switch being connected in series with the first and second steering switches at a first common node, the first chopping switch receiving at its first terminal a baseband signal to be modulated and up-converted by the switching circuit and receiving at its control terminal a first switching control signal, and the second chopping switch is connected in series with the third and fourth steering switches at a second common node, the second chopping switch receiving at its control terminal a second switching control signal and the first and second chopping switches are connected at a third common node, first terminals of the first and third steering switches being connected to a first output node, and first terminals of the second and fourth steering switches being connected to a second output node, wherein in a phase noise reducing mode the control terminal of the first chopping switch is driven by the first switching control signal which has a frequency that is a multiple of the first frequency, the first switching control signal and the first switching signal having a relative phase relationship such that the first chopping switch is non-conducting such that current flow in the first and second steering switches is inhibited while the first and second steering switches are changing between being conducting and being non-conducting, and the second chopping switch is driven by the second switching control signal in anti-phase with the first switching control signal, the second switching control signal and the third switching signal having a relative phase relationship such that the second chopping switch is non-conducting so that current flow in the third and fourth steering switches is inhibited while the third and fourth steering switches are changing between being conducting and non-conducting.

25. A switching circuit operable to reduce phase noise in an output of the switching circuit comprising:

first, second, third and fourth steering switches operable to make or break a path between first and second terminals thereof, and each steering switch further having a control terminal for controlling the switch, the first, second, third and fourth steering switches having their control terminals driven by first, second, third and fourth switching signals, respectively, provided by a frequency divider, the first, second, third and fourth switching signals having a first frequency and the second switching signal being in anti-phase with the first switching signal and the third switching signal being in anti-phase with the fourth switching signal;

first and second chopping switches operable to make or break a path between first and second terminals thereof and each having a control terminal, the first chopping switch being connected in series with the first and second steering switches at a first common node, the first chopping switch receiving at its first terminal a baseband signal to be modulated and up-converted by the switching circuit and receiving at its control terminal a first switching control signal, and the second chopping switch is connected in series with the third and fourth steering switches at a second common node, the second chopping switch receiving at its control terminal a second switching control signal and the first and second chopping switches are connected at a third common node wherein, in a phase noise reducing mode, the control terminal of the first chopping switch is driven by the first switching control signal which has a frequency that is a multiple of the first frequency, the first switching control signal and the first switching signal having a relative phase relationship such that the first chopping switch is always non-conducting while the first and second steering switches are changing between being conducting and being non-conducting, and the second chopping switch is driven by the second switching control signal in anti-phase with the first switching control signal, the second switching control signal and the third switching signal having a relative phase relationship such that the second chopping switch is always non-conducting while the third and fourth steering switches are changing between being conducting and being non-conducting;

a phase shifter for adjusting a timing relationship between the first to fourth switching signals and the first switching control signal; and a timing detector for determining whether the timing relationship is correct or not so as to determine whether to vary the phase shift introduced by the phase shifter.

* * * * *

UNITED STATES PATENT AND TRADEMARK OFFICE
CERTIFICATE OF CORRECTION

PATENT NO. : 7,750,749 B2  Page 1 of 1
APPLICATION NO. : 11/315720
DATED : July 6, 2010
INVENTOR(S) : Christopher Geraint Jones It is certified that error appears in the above-identified patent and that said Letters Patent is hereby corrected as shown below:

On the title page, item (30), correct the application number of the Foreign Application Priority Data from "0522477" to -- 0522477.9 --.

Signed and Sealed this

Twenty-third Day of November, 2010

David J. Kappos
*Director of the United States Patent and Trademark Office*